US010956768B2

(12) United States Patent
Dorr et al.

(10) Patent No.: US 10,956,768 B2
(45) Date of Patent: Mar. 23, 2021

(54) FEEDBACK COOLING AND DETECTION FOR OPTOMECHANICAL DEVICES

(71) Applicant: Honeywell International Inc., Morris Plains, NJ (US)

(72) Inventors: Joshua Dorr, Minneapolis, MN (US); Chad Fertig, Bloomington, MN (US); Arthur Savchenko, Kirkland, WA (US); Steven Tin, Plymouth, MN (US); Neil Krueger, Saint Paul, MN (US)

(73) Assignee: Honeywell International Inc., Charlotte, NC (US)

( * ) Notice: Subject to any disclaimer, the term of this patent is extended or adjusted under 35 U.S.C. 154(b) by 217 days.

(21) Appl. No.: 16/391,114

(22) Filed: Apr. 22, 2019

(65) Prior Publication Data

US 2020/0334484 A1 Oct. 22, 2020

(51) Int. Cl.
*G06K 9/40* (2006.01)
*G01B 11/02* (2006.01)
(Continued)

(52) U.S. Cl.
CPC ............... *G06K 9/40* (2013.01); *G01B 11/02* (2013.01); *G01P 15/003* (2013.01);
(Continued)

(58) Field of Classification Search
None
See application file for complete search history.

(56) References Cited

U.S. PATENT DOCUMENTS 3,499,331 A    3/1970 Miller
4,233,847 A    11/1980 Walker
(Continued)

FOREIGN PATENT DOCUMENTS

CN    107219378 A    9/2017
CN    108519498 A    9/2018
(Continued)

OTHER PUBLICATIONS

Optical Dilution and Feedback Cooling of a Gram-Scale Oscillator to 6.9 mK Thomas Corbitt, Christopher Wipf, Timothy Bodiya, David Ottaway, Daniel Sigg, Nicolas Smith, Stanley Whitcomb, and Nergis Mavalvala. Phys. Rev. Lett. 99, 160801—Published Oct. 18, 2007 (Year: 2007).*

(Continued)

*Primary Examiner* — Paul M. West
*Assistant Examiner* — Mark A Shabman
(74) *Attorney, Agent, or Firm* — Shumaker & Sieffert, P.A.

(57) ABSTRACT

An optomechanical device for modulating an optical signal for reducing thermal noise and tracking mechanical resonance of a proof mass assembly comprises a circuit configured to receive, from a light-emitting device, the optical signal and modulate the optical signal to remove thermal noise and to drive a mechanical response frequency to the mechanical resonance of the proof mass assembly using a cooling feedback signal and a mechanical resonance feedback signal. The circuit is further configured to generate, using the modulated optical signal, the cooling feedback signal to correspond to a thermal noise signal of the modulated optical signal with a total loop gain of zero and a phase difference of 180 degrees and generate, using the modulated optical signal, the mechanical resonance feedback signal to drive the mechanical response frequency of the modulated optical signal to the mechanical resonance.

20 Claims, 8 Drawing Sheets

(51) Int. Cl.
*G01P 15/00* (2006.01)
*G01P 15/097* (2006.01)
*H01S 5/00* (2006.01)
*H04J 14/02* (2006.01)

(52) U.S. Cl.
CPC .......... *G01P 15/097* (2013.01); *H01S 5/0014* (2013.01); *H01S 5/0085* (2013.01); *H04J 14/0202* (2013.01)

(56) References Cited

U.S. PATENT DOCUMENTS

| | | |
|---|---|---|
| 4,345,482 A | 8/1982 | Adolfsson et al. |
| 4,422,331 A | 12/1983 | Walker |
| 4,428,234 A | 1/1984 | Walker |
| 4,628,175 A | 12/1986 | Nissl |
| 4,733,561 A | 3/1988 | Gilby |
| 4,739,660 A | 4/1988 | Fima |
| 4,897,541 A | 1/1990 | Philips |
| 4,900,918 A | 2/1990 | Killian |
| 5,013,909 A | 5/1991 | Sondergeld et al. |
| 5,109,693 A | 5/1992 | Hojo et al. |
| 5,291,014 A | 3/1994 | Brede et al. |
| 5,496,436 A | 3/1996 | Bernstein et al. |
| 5,501,103 A | 3/1996 | Woodruff et al. |
| 5,559,358 A | 9/1996 | Burns et al. |
| 5,689,107 A | 11/1997 | Hsu |
| 5,770,473 A | 6/1998 | Hall et al. |
| 5,786,927 A | 7/1998 | Greywall |
| 6,018,390 A | 1/2000 | Youmans et al. |
| 6,182,509 B1 | 2/2001 | Leung |
| 6,350,983 B1 | 2/2002 | Kaldor et al. |
| 6,481,283 B1 | 11/2002 | Cardarelli |
| 6,510,737 B1 | 1/2003 | Hobbs et al. |
| 6,546,798 B1 | 4/2003 | Waters et al. |
| 6,594,061 B2 | 7/2003 | Huang et al. |
| 6,745,627 B1 | 6/2004 | Woodruff et al. |
| 6,763,723 B1 | 7/2004 | Zook et al. |
| 6,789,053 B2 | 9/2004 | Collins |
| 6,807,325 B1 | 10/2004 | Kraemmer et al. |
| 6,911,765 B2 | 6/2005 | Kawashima |
| 6,947,642 B2 | 9/2005 | Yamazaki |
| 6,955,085 B2 | 10/2005 | Jones et al. |
| 7,243,542 B2 | 7/2007 | Hulsing, II |
| 7,355,720 B1* | 4/2008 | Carr .................. G01H 9/004 356/498 |
| 7,427,522 B2 | 9/2008 | Morikawa et al. |
| 7,573,924 B2 | 8/2009 | Tsuda et al. |
| 7,612,887 B2 | 11/2009 | Choi et al. |
| 7,613,367 B2 | 11/2009 | Levy et al. |
| 7,743,661 B2 | 6/2010 | Berthold et al. |
| 7,808,618 B1 | 10/2010 | Tawney et al. |
| 7,822,090 B2 | 10/2010 | Minamio et al. |
| 7,881,565 B2 | 2/2011 | Kilic et al. |
| 7,920,270 B2 | 4/2011 | Chow et al. |
| 7,980,115 B2 | 7/2011 | Stewart et al. |
| 8,159,736 B2 | 4/2012 | Maleki et al. |
| 8,288,926 B2 | 10/2012 | Furuhata et al. |
| 8,334,984 B2 | 12/2012 | Perez et al. |
| 8,537,368 B2 | 9/2013 | Kilic et al. |
| 8,677,821 B2 | 3/2014 | Ayazi et al. |
| 8,726,732 B2 | 5/2014 | Littler et al. |
| 8,875,578 B2 | 11/2014 | Smith |
| 8,904,867 B2 | 12/2014 | Martin et al. |
| 8,960,002 B2 | 2/2015 | Nasiri et al. |
| 9,069,004 B2 | 6/2015 | Bhave et al. |
| 9,194,782 B2 | 11/2015 | Jeon et al. |
| 9,207,081 B2 | 12/2015 | Geen |
| 9,228,916 B2 | 1/2016 | Valdevit et al. |
| 9,239,340 B2 | 1/2016 | Hutchinson et al. |
| 9,261,525 B2 | 2/2016 | Thiruvenkatanathan et al. |
| 9,335,271 B2 | 5/2016 | Pruessner et al. |
| 9,417,260 B2 | 8/2016 | Bulatowicz |
| 9,455,354 B2 | 9/2016 | Acar |
| 9,618,531 B2* | 4/2017 | Painter .................. G01N 21/59 |
| 9,753,055 B2 | 9/2017 | Paquet et al. |
| 9,766,099 B2 | 9/2017 | Pechstedt |
| 9,927,458 B2 | 3/2018 | Bramhavar et al. |
| 9,983,225 B2 | 5/2018 | Fertig et al. |
| 10,031,158 B1 | 7/2018 | Douglas et al. |
| 10,079,467 B2 | 9/2018 | Guzman et al. |
| 10,107,936 B2 | 11/2018 | Compton |
| 10,126,321 B2 | 11/2018 | Zandi et al. |
| 10,139,564 B1 | 11/2018 | Homeijer et al. |
| 2004/0129867 A1 | 7/2004 | Mackey |
| 2013/0204573 A1 | 8/2013 | Kandler |
| 2014/0043614 A1 | 2/2014 | Dhayalan et al. |
| 2015/0020590 A1 | 1/2015 | Painter et al. |
| 2015/0177272 A1* | 6/2015 | Clark ................ G01C 19/5755 850/5 |
| 2016/0139170 A1 | 5/2016 | Dwyer et al. |
| 2017/0057809 A1 | 3/2017 | Saint-patrice et al. |
| 2017/0089944 A1 | 3/2017 | Duraffourg |
| 2017/0242050 A1 | 8/2017 | Pan et al. |
| 2018/0003749 A1 | 1/2018 | Dogiamis et al. |
| 2018/0128850 A1 | 5/2018 | Bramhavar et al. |
| 2018/0172723 A1 | 6/2018 | Bramhavar et al. |
| 2018/0246139 A1 | 8/2018 | Zotov et al. |
| 2018/0267078 A1 | 9/2018 | Sato |
| 2019/0049485 A1 | 2/2019 | Stewart et al. |

FOREIGN PATENT DOCUMENTS

| | | |
|---|---|---|
| EP | 1310801 A1 | 5/2003 |
| EP | 3112879 A1 | 1/2017 |
| JP | 2018132500 A | 8/2018 |
| WO | 0071981 A1 | 11/2000 |
| WO | 2008043737 A2 | 4/2008 |
| WO | 2015/080662 A1 | 6/2015 |
| WO | 2018197857 A1 | 11/2018 |

OTHER PUBLICATIONS

Krause et al., "Optical read out and feedback cooling of a nanostring optomechanical cavity," Laboratory of Applied Physics, California Institute of Technology, Jun. 3, 2015, 13 pp.

Krause et al., "A high-resolution microchip optomechanical accelerometer," Nature Photonics, Oct. 14, 2012, 5 pp.

Chen et al., "Optical Microfiber Technology for Current, Temperature, Acceleration, Acoustic, Humidity and Ultraviolet Light Sensing," Laser Physics and Photonic Devices Laboratories, School of Engineering, University of Austrailia, sensors, MDPI, Dec. 28, 2017, 25 pp.

Gerberding et al., "Optomechanical reference accelerometer," Joint Quantum Institute, University of Maryland, Apr. 4, 2015, 13 pp.

Beyazoglu, "Integrated MEMS Cavity Optomechanical Oscillators for Wireless and Optical Communications," Electrical Engineering and Computer Sciences University of California at Berkeley, Aug. 12, 2016, 130 pp.

Chiu et al., "Development and Characterization of a CMOS-MEMS Accelerometer With Differential LC-Tank Oscillators," Journal of Microelectromechanical Systems, vol. 22, No. 6, Dec. 2013, pp. 1285-1295.

Cohen et al., "High-Q microphotonic electro-optic modulator," Department of Electrical Engineering, University of Southern California, PERGAMON, Solid-State Electronics, vol. 45, Mar. 29, 2001, 13 pp.

Gutter, "Optical Whispering-Gallery Mode Resonators for Applications in Optical Communication and Frequency Control," Electrical Engineering and Computer Sciences University of California at Berkeley, Dec. 20, 2013, 127 pp.

Hutchison et al., "Z-Axis Optomechnical Accelerometer," IEEE 25th International Conference on Micro Electro Mechanical Systems (MEMS), Jan. 29 through Feb. 2, 2012, 5 pp.

Kavitha et al., "Study of squeeze film damping characteristics under different gas mediums in a capacitive MEMS accelerometer," The Brazilian Society of Mechanical Sciences and Engineering, Feb. 20, 2015, 12 pp.

(56) References Cited

OTHER PUBLICATIONS

Lee et al., "Fabrication of a Micro-Opto-Mechanical Accelerometer Based on Intensity Modulation", Microsystems Technologies, vol. 10, Issue 2, Jan. 2004, 12 pp.

Li et al., "Characterization and Testing of a Micro-g Whispering Gallery Mode Optomechanical Accelerometer," Journal of Lightwave Technology, vol. 36, Issue 18, May 25, 2018, 8 pp.

Lu et al. "Optical Acceleration Measurement Method with Large Non-ambiguity Range and High Resolution via Synthetic Wavelength and Single Wavelength Superheterodyne Interferometry," MDPI, Sensors, vol. 18, Oct. 12, 2018, 11 pp.

Miao et al., "A microelectromechanically controlled cavity optomechanical sensing system," New Journal of Physics, Apr. 4, 2012, 17 pp.

Oudich et al., "Optomechanic interaction in a corrugated phoxonic nanobeam cavity," Physical Review B, Jun. 2014, 9 pp.

Pruessner et al., "Integrated waveguide-BDR microcavity optomechanical system," Optical Society of America, Optics Express, vol. 19, No. 22, Oct. 24, 2011, 15 pp.

Schliesser et al., "High-sensitivity monitoring of micromechanical vibration using optical whispering gallery mode resonators," New Journal of Physics, vol. 10, Sep. 30, 2008, 25 pp.

Sheikhaleh et al., "An Optical MEMS Accelerometer Based on a Two-Dimensional Photonic Crystal Add-Drop Filter," IEEE, Journal of Lightwave Technology, vol. 35, No. 14, Jul. 15, 2017, 6 pp.

U.S. Appl. No. 16/371,657, filed Apr. 1, 2019, by Fertig et al.
U.S. Appl. No. 16/371,762, filed Apr. 1, 2019, by Fertig et al.
U.S. Appl. No. 16/391,074, filed Apr. 22, 2019, by Dorr et al.
U.S. Appl. No. 16/539,949, filed Aug. 13, 2019, by Krueger et al.
U.S. Appl. No. 16/514,864, filed Jul. 17, 2019, by Krueger et al.
U.S. Appl. No. 16/514,905, filed Jul. 17, 2019, by Krueger et al.
U.S. Appl. No. 16/539,984, filed Aug. 13, 2019, by Krueger et al.
U.S. Appl. No. 16/539,974, filed Aug. 13, 2019, by Dorr et al.

Williamson et al., "Dual-Carrier Floquet Circulator with Time-Modulated Optical Resonators," Microelectronics Research Center, American Chemical Society, ACS Photonics, vol. 5, Aug. 20, 2018, 9 pp.

Yen et al., "Corrugated aluminum nitride energy harvesters for high energy conversion effectiveness," Journal of Micromechanics and Microengineering, vol. 21, No. 8, Jul. 2011, 3 pp.

Zhang et al., "A Compact Low-Power Oscillation Circuit for the High Performance Silicon Oscillating Accelerometer," AIP Conference Proceedings 1890, 040068, Oct. 5, 2017, 7 pp.

Zhang et al., "Noise suppression of a micro-grating accelerometer based on the dual modulation method," OSA Publishing, Applied Optics, vol. 56, Issue 36, Apr. 2, 2019, 4 pp.

Extended Search Report from counterpart European Application No. 20158640.1, dated Aug. 26, 2020, 8 pp.

Response to Search Report dated Aug. 26, 2020, from counterpart European Application No. 20158640.1, filed Dec. 3, 2020, 13 pp.

* cited by examiner

FEEDBACK COOLING AND DETECTION FOR OPTOMECHANICAL DEVICES

STATEMENT REGARDING FEDERALLY SPONSORED RESEARCH OR DEVELOPMENT

This invention was made with Government support under N66001-16-C-4018 awarded by SPAWAR Systems Center Pacific. The Government has certain rights in the invention. This material is based upon work supported by the Defense Advanced Research Projects Agency (DARPA) and Space and Naval Warfare Systems Center Pacific (SSC Pacific).

TECHNICAL FIELD

This disclosure relates to optomechanical devices, such as accelerometers configured to measure acceleration using a modulated optical signal.

BACKGROUND

Optomechanical devices include devices for detecting acceleration (i.e., accelerometers), velocity, vibration, and other parameters. For example, in an optomechanical accelerometer, the resonance frequency of a mechanical structure is shifted under acceleration in the optomechanical device. The mechanical resonance frequency can be read out with an optical field by applying near-resonant light to the structure's optical resonance and measuring the transmitted or reflected light.

SUMMARY

In general, the disclosure is directed to devices, systems, and techniques for feedback "cooling" optomechanical devices. As used herein, cooling may refer to mitigating effects of thermal noise on an optomechanical resonator. For example, at room temperature, thermal noise can limit performance by causing instability (e.g. randomized fluctuations) in the mechanical frequency. This instability can limit the ultimate noise floor and hence performance of the optomechanical device, Specifically, an optomechanical device may be configured to use a tuned cooling feedback loop to cool the mechanical temperature, while injecting a large (e.g., a gain of greater than 20 dB), stable mechanical drive signal to drive the optomechanical device at the desired mechanical amplitude, which may help to mitigate the effects of thermal noise on the optomechanical resonator.

In one example, an optomechanical device for modulating an optical signal for reducing thermal noise and tracking mechanical resonance of a proof mass assembly includes a circuit configured to receive, from a light-emitting device, the optical signal, modulate the optical signal to remove thermal noise and to drive a mechanical response frequency to the mechanical resonance of the proof mass assembly using a cooling feedback signal and a mechanical resonance feedback signal, generate, using the modulated optical signal, the cooling feedback signal to correspond to a thermal noise signal of the modulated optical signal with a total loop gain of zero and a phase difference of 180 degrees, and generate, using the modulated optical signal, the mechanical resonance feedback signal to drive the mechanical response frequency of the modulated optical signal to the mechanical resonance.

In another example, a method for modulating an optical signal for reducing thermal noise and tracking mechanical resonance of a proof mass assembly that includes receiving, by a circuit, from a light-emitting device, the optical signal, modulating, by the circuit, the optical signal to remove thermal noise and to drive a mechanical response frequency to the mechanical resonance of the proof mass assembly using a cooling feedback signal and a mechanical resonance feedback signal, generating, by the circuit, using the modulated optical signal, the cooling feedback signal to correspond to a thermal noise signal of the modulated optical signal with a total loop gain of zero and a phase difference of 180 degrees, and generating, by the circuit, using the modulated optical signal, the mechanical resonance feedback signal to drive the mechanical response frequency of the modulated optical signal to the mechanical resonance.

In another example, an optomechanical system for modulating an optical signal for reducing thermal noise and tracking mechanical resonance of a proof mass assembly includes a light-emitting device configured to emit the optical signal, the proof mass assembly, and a circuit. The circuit is configured to receive, from the light-emitting device, the optical signal, modulate the optical signal to remove thermal noise and to drive a mechanical response frequency to the mechanical resonance of the proof mass assembly using a cooling feedback signal and a mechanical resonance feedback signal, generate, using the modulated optical signal, the cooling feedback signal to correspond to a thermal noise signal of the modulated optical signal with a total loop gain of zero and a phase difference of 180 degrees, and generate, using the modulated optical signal, the mechanical resonance feedback signal to drive the mechanical response frequency of the modulated optical signal to the mechanical resonance.

The summary is intended to provide an overview of the subject matter described in this disclosure. It is not intended to provide an exclusive or exhaustive explanation of the systems, device, and methods described in detail within the accompanying drawings and description below. Further details of one or more examples of this disclosure are set forth in the accompanying drawings and in the description below. Other features, objects, and advantages will be apparent from the description and drawings, and from the claims.

BRIEF DESCRIPTION OF DRAWINGS

Like reference characters denote like elements throughout the description and figures.

DETAILED DESCRIPTION

Figure 1:
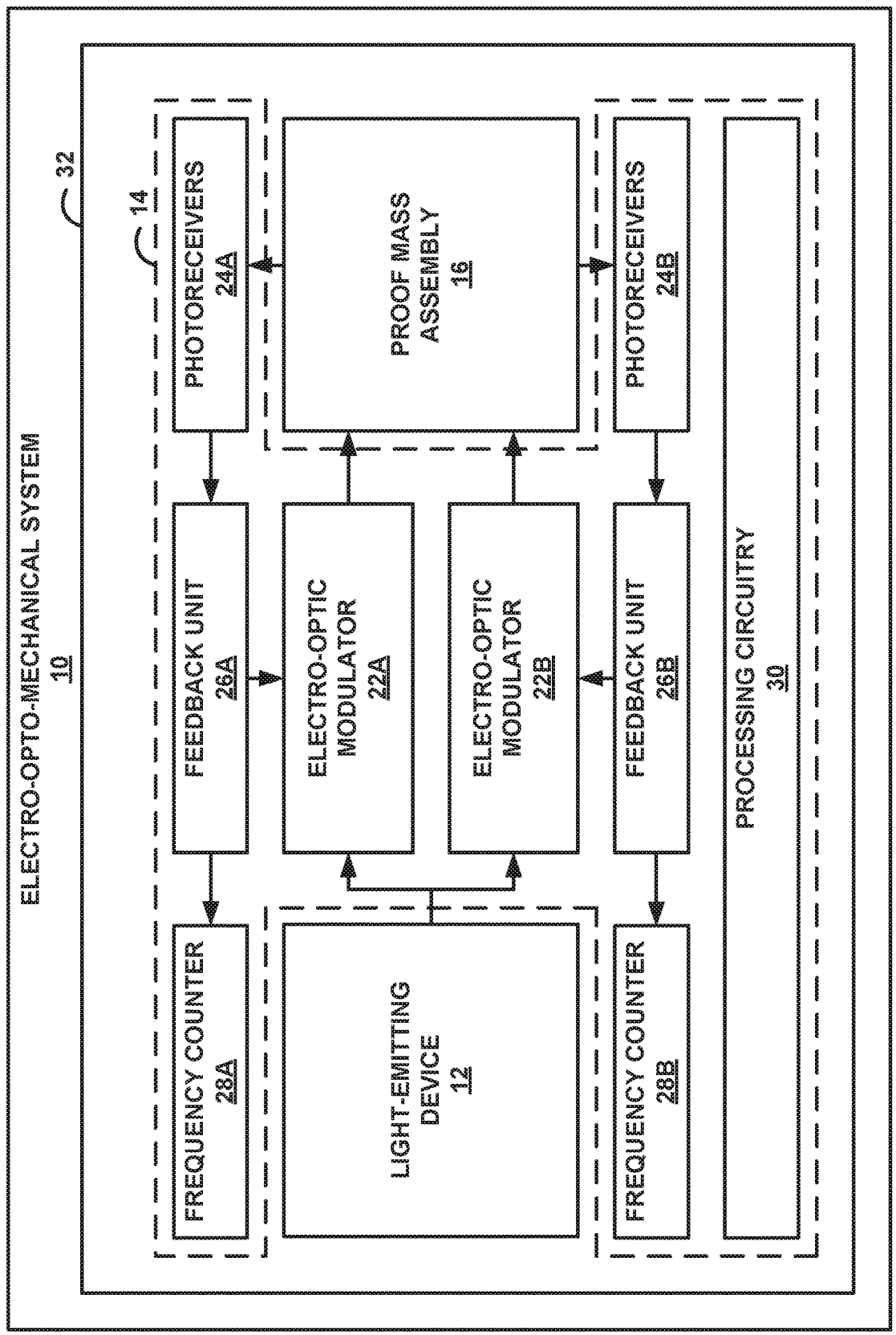
FIG. 1 is a block diagram illustrating an electro-optomechanical system, in accordance with one or more techniques of this disclosure.

This disclosure describes devices, systems, and techniques for cooling optomechanical devices to mitigate the effects of thermal noise. For example, the optomechanical device may include an electro-opto-mechanical system configured to precisely measure very high acceleration values (e.g., up to 500,000 meters per second squared ($m/s^2$)). The electro-opto-mechanical system may use a combination of electrical signals, optical signals, and mechanical signals to determine the acceleration of the object.

An optomechanical device may be configured to measure the acceleration, velocity, vibration, etc. of the object in real-time or near real-time, such that processing circuitry may analyze the acceleration, velocity, vibration, etc. of the object over a period of time to determine a positional displacement of the object during the period of time. For example, the optomechanical device may be a part of an Inertial Navigation System (INS) for tracking a position of an object based, at least in part, on an acceleration of the object. Additionally, the optomechanical device may be located on or within the object such that the optomechanical device accelerates, moves, vibrates, etc. with the object. As such, when the object accelerates, moves, vibrates, etc., the optomechanical device (including the proof mass) accelerates, moves, vibrates, etc. with the object. In some examples, because acceleration over time is a derivative of velocity over time, and velocity over time is a derivative of position over time, processing circuitry may, in some cases, be configured to determine the position displacement of the object by performing a double integral of the acceleration of the object over the period of time. Determining a position of an object using the accelerometer system located on the object—and not using on a navigation system separate from the object (e.g., a Global Positioning System (GPS))—may be referred to as "dead reckoning."

The optomechanical device may be configured to achieve high levels of sensitivity in order to improve the accuracy of the acceleration, velocity, vibration, etc. values. High sensitivity may enable the optomechanical device to detect very small acceleration, velocity, vibration, etc. values, detect a very small change in acceleration, velocity, vibration, etc. values, detect a large range of acceleration, velocity, vibration, etc. values, or any combination thereof. Additionally, an optomechanical device may be configured to accurately determine the acceleration, velocity, vibration, etc. of the object while the object is experiencing high levels of acceleration, velocity, vibration, etc. in this way, the an optomechanical device may be configured to enable an INS to accurately track the position of the object while a magnitude of the acceleration, velocity, vibration, etc. of the object is very high.

The optomechanical device may, in some examples, include a micro-electro-mechanical system (MEMS) accelerometer which includes a light-emitting device, a circuit, and a proof mass assembly which includes a proof mass suspended within a frame by double-ended tuning fork (DETF) structures. In some examples, the optomechanical device may include a single-ended tuning fork or another structure.

In some examples, the DETF structures may be configured to carry optical signals. Additionally, optical signals may induce mechanical vibration in the DETF structures. In some cases, acceleration causes a displacement of the proof mass relative to the frame, the displacement affecting mechanical vibration frequencies (e.g., mechanical resonance frequencies) corresponding to the DETF structures. In this way, a mathematical relationship may exist between acceleration and the mechanical vibration frequencies of the DETF structures. As such, the mathematical relationship may be leveraged to determine acceleration. The accelerometer device uses, in some examples, a combination of optical signals and electrical signals to measure the mechanical vibration frequencies corresponding to the DETF structures and calculate acceleration based on the mechanical vibration frequencies.

For example, processing circuitry may be configured to modulate, using an electro-optic modulator (EOM), an optical signal emitted by the light-emitting device. The modulated optical signal propagates through a MAT structure of the proof mass assembly, inducing mechanical vibration in the DETF structure. Additionally, the mechanical vibration further modulates the modulated optical signal such that the mechanical vibration frequency of the DETF structure is reflected in the modulated optical signal after the modulated optical signal passes through the DETF structure. The modulated optical signal arrives at a photoreceiver, which converts the modulated optical signal into an electrical signal. Additionally, the photoreceiver may preserve properties of the modulated optical signal when creating the electrical signal (e.g., preserve the mechanical vibrating frequency of the DETF structure). In this way, the circuit may process the electrical signal and analyze the processed electrical signal to determine the mechanical vibrating frequency of the DETF structure. Based on the mechanical vibrating frequency, processing circuitry may determine the acceleration of the object carrying the accelerometer system.

The optomechanical device may employ a positive feedback loop to simplify a manner in which the acceleration of the object is measured. For example, the circuit may direct the processed electric signal to the EOM, which modulates the optical signal emitted by the light-emitting device based on the processed electrical signal. In this way, the optical signal input to the proof mass assembly depends, at least in part, on the optical signal output from the proof mass assembly to the circuit. By using the positive feedback loop, the accelerometer system may improve an efficiency in which the circuit calculates the acceleration (e.g., decreases a number of steps required to calculate the acceleration). For example, to calculate the acceleration value, processing circuitry may subtract a baseline frequency value from the mechanical vibration frequency of the DETF structure to obtain a frequency difference value. The baseline frequency value may, in some cases, represent a mechanical vibration frequency of the DETF structure while the proof mass is not displaced along the proof mass displacement axis (i.e., acceleration is 0 $m/s^2$). In some examples, the frequency difference value is correlated with acceleration, enabling the processing circuitry to use the correlation to determine acceleration based on the frequency difference value. As such, the positive feedback loop may ensure that a small number of calculation steps is required to determine acceleration.

However, at room temperature, thermal noise can limit performance by causing instability (e.g. randomized fluctuations) in a mechanical frequency of the proof mass assembly (e.g., DETF structure). This instability can limit the ultimate noise floor (and hence performance) of the accelerometer device. Accordingly, this disclosure describes a cooling feedback loop that applies a cooling feedback that is 180 degrees out of phase with noise fluctuations due to temperature to mitigate the effects of thermal noise on the proof mass assembly (e.g., DETF structure). While the foregoing example was discussed with respect to acceleration, the optomechanical device may be configured to determine velocity, vibration, or another parameter.

While examples of an optomechanical device are described with respect to an example accelerometer, techniques described herein for cooling thermal noise may be applied to optomechanical device configured to measure various parameters, including, but not limited to, acceleration, velocity, vibration, and other parameters. Moreover, while examples of the optomechanical device are described with respect to an example proof mass assembly that includes a DETF structure, other structures may be used, for example, but not limited to, a single-ended tuning fork structure or another structure.

FIG. 1 is a block diagram illustrating an electro-opto-mechanical system 10, in accordance with one or more techniques of this disclosure. FIG. 1 is merely one non-limiting example system architecture that may utilize the techniques of this disclosure. As illustrated in FIG. 1, system 10 includes light-emitting device 12, circuit 14, proof mass assembly 16, and housing 32. Additionally, in the example illustrated in FIG. 1, circuit 14 includes electro-optic-modulators (EOM) 22A, 22B (collectively, "EOMs 22"), photoreceivers 24A, 24B (collectively, "photoreceivers 24"), feedback units 26A, 26B (collectively, "feedback units 26"), frequency counters 28A, 28B (collectively, "frequency counters 28"), and processing circuitry 30. While the example of FIG. 1 includes two EOMs, two photoreceivers, and two frequency counters, in some examples, an electro-opto-mechanical system may include only one EOM, one photoreceivers, and one frequency counters or more than two EOMs, two photoreceivers, and two frequency counters.

In the example of FIG. 1, light-emitting device 12, proof mass assembly 16, EOM 22A, photoreceiver 24A, feedback unit 26A, and frequency counter 28A form a first positive feedback loop. Additionally, in the example of FIG. 1, light-emitting device 12, proof mass assembly 16, EOM 22B, photoreceiver 24B, feedback unit 26B, and frequency counter 28B form a second positive feedback loop. In some examples, the second positive feedback loop may be omitted.

System 10 may, in some examples, be configured to determine an acceleration associated with an object (not illustrated in FIG. 1) based on a measured vibration frequency of a tuning fork structure of proof mass assembly. For example, system 10 may be configured to determine an acceleration associated with an object (not illustrated in FIG. 1) based on a measured vibration frequency of a set of double-ended tuning fork (DETF) structures which suspend a proof mass of proof mass assembly 16, where the vibration of the DETF structures is induced by an optical signal emitted by light-emitting device 12. In some examples, the first positive feedback loop generates a first frequency value representing a vibration frequency of a first DETF structure and the second positive feedback loop generates a second frequency value representing a vibration frequency of a second DETF structure. Based on the first vibration frequency and the second vibration frequency, system 10 may determine a first acceleration value and a second acceleration value, respectively. In some examples, system 10 determines an acceleration of an object based on the first acceleration value and the second acceleration value. In some examples, system 10 determines the acceleration of the object based on only the first acceleration value (e.g., the second positive feedback loop is omitted). In some examples, system 10 determines the acceleration of the object based on only the second acceleration value (e.g., the first positive feedback loop is omitted).

Light-emitting device 12 may, in some cases, include a laser device configured to emit photons. In some examples, light-emitting device 12 emits the photons at an optical power within a range between 0.1 microwatts ($\mu$W) and 100 $\mu$W. In some examples, light-emitting device 12 is a semiconductor laser which includes a laser diode.

In some examples, circuit 14 may include a set of electrical components for processing and analyzing electrical signals received by photoreceivers 24. Components of circuit 14 are described in further detail below.

EOMs 22 may represent optical devices configured to modulate, based on electrical signals produced and processed by circuit 14, an optical signal emitted by light-emitting device 12. EOM 22A, for example, may include a set of crystals (e.g., Lithium Niobate crystals), where a refractive index of the set of crystals changes as a function of an electric field proximate to the set of crystals. The refractive index of the crystals may determine a manner in which EOM 22A modulates the optical signal. For example, the crystals of EOM 22A may receive the optical signal from light-emitting device 12 while EOM 22A is also receiving an electrical signal from feedback unit 26A of circuit 14. As such, the electrical signal may affect the electric field proximate to the crystals of EOM 22A, thus causing EOM 22A to modulate the optical signal. In some examples, EOM 22A modulates the optical signal by modulating the refractive index of the crystals using the electrical signal. EOM 22A, in some cases, may transmit the modulated optical signal to proof mass assembly 16. In some examples, EOM 22B is substantially similar to EOM 22A, with EOM 22B controlled by an electrical signal from feedback unit 26B.

Photoreceivers 24 may each include one or more transistors configured to absorb photons of an optical signal and output, in response to absorbing the photons, an electrical signal. In this manner, photoreceivers 24 may be configured to convert optical signals into electrical signals. Photoreceivers 24A, for example, may include a p-n junction that converts the photons of the optical signal into the electrical signal, where the electrical signal preserves at least some parameters of the optical signal. One or more frequency values and intensity values associated with the optical signal may be reflected in the electrical signal produced by photoreceivers 24A in response to photoreceivers 24A receiving the optical signal. For example, photoreceivers 24A may produce a stronger electrical signal (e.g., greater current magnitude) in response to receiving a stronger (e.g., greater power) optical signal, Additionally, in some cases, photoreceivers 24A may produce the electrical signal to reflect the one or more frequency values corresponding to the received optical signal. In other words, processing circuitry (e.g., processing circuitry 30) may analyze the electrical signal to determine the one or more frequency values corresponding to the optical signal, Photoreceivers 24A may include semiconductor materials such as any combination of Indium Gallium Arsenide, Silicon, Silicon Carbide, Silicon Nitride, Gallium Nitride, Germanium, or Lead Sulphide. In some examples, photoreceivers 24B is substantially similar to photoreceivers 24A.

Feedback units 26 may each include a set of circuit components for processing electrical signals. In some examples, the set of circuit components included in feedback unit 26A may include any combination of a band pass filter, a phase shifter, an electronic amplifier, and a voltage limiter. Such components may process, or filter, the electrical signal such that certain aspects of the electrical signal may be more efficiently measured (e.g., frequency values or intensity values). In the example of FIG. 1, feedback unit 26A may receive an electrical signal from photoreceiver 24A and output a processed electrical signal to EOM 22A and frequency counter 28A. In this way, feedback unit 26A acts as a part of a first positive feedback loop by processing an electrical signal which EOM 22A uses to modulate an optical signal emitted by light-emitting device 12, where the modulated optical signal passes through proof mass assembly 16 before arriving back at circuit 14 for processing by feedback unit 26A. Feedback unit 26B may be substantially similar to feedback unit 26A in that feedback unit 26B receives an electrical signal from photoreceiver 24B, and delivers a processed electrical signal to frequency counter 28B and EOM 229. As such, feedback unit 269 operates within a second feedback loop in a similar manner to which feedback unit 26A operates within the first feedback loop. Again, feedback unit 26B may be omitted.

Feedback units 26 may each include a cooling feedback loop that applies a cooling feedback that is 180 degrees out of phase with noise fluctuations due to temperature to mitigate the effects of thermal noise on proof mass assembly 16. For example, feedback unit 26A may include a cooling feedback that is 180 degrees out of phase with noise fluctuations due to temperature to mitigate the effects of thermal noise on proof mass assembly 16. In examples, where feedback unit 26A is included, feedback unit 26B may include a cooling feedback that is 180 degrees out of phase with noise fluctuations due to temperature to mitigate the effects of thermal noise on proof mass assembly 16.

Frequency counters 28 are circuit components that are each configured for measuring a frequency of an electrical signal. For example, frequency counter 28A may determine one or more frequency values corresponding to the processed electrical signal produced by feedback unit 26A, Frequency counter 28A may measure frequency values corresponding to the processed electrical signal in real-time or near real-time, such that frequency counter 28A tracks the frequency values as a function of time. Frequency counter 28B may be substantially similar to frequency counter 28A, except frequency counter 28B receives an electrical signal from feedback unit 26B rather than from feedback unit 26A.

Processing circuitry 30, and circuit 14 generally, may include one or more processors that are configured to implement functionality and/or process instructions for execution within system 10. For example, processing circuitry 30 may be capable of processing instructions stored in a storage device (not illustrated in FIG. 1). Processing circuitry 30 may include, for example, microprocessors, digital signal processors (DSPs), application specific integrated circuits (ASICs), field-programmable gate arrays (FPGAs), or equivalent discrete or integrated logic circuitry, or a combination of any of the foregoing devices or circuitry. Accordingly, processing circuitry 30 may include any suitable structure, whether in hardware, software, firmware, or any combination thereof, to perform the functions ascribed herein to processing circuitry 30. Processing circuitry 30, and circuit 14 may include only analog circuitry, only digital circuitry, or a combination of analog circuitry and digital circuitry. The term "processor" or "processing circuitry" may generally refer to any of the foregoing analog circuitry and/or digital circuitry, alone or in combination with other logic circuitry, or any other equivalent circuitry.

Proof mass assembly 16 may include a proof mass, a frame, a set of tethers, and a set of DETF structures. The proof mass, in some examples, is suspended within the frame by the set of tethers and the set of DETF structures. For example, proof mass assembly 16 may include a set of DETF structures that suspend the proof mass in a first direction relative to the frame. Additionally, the set of tethers may suspend the proof mass in a second direction and a third direction relative to the frame. The first direction, the second direction, and the third direction may represent three axes (e.g., x-axis, y-axis, and z-axis) of a Cartesian space. In some cases, the set of DETF structures enable the proof mass to be displaced in the first direction. Additionally, in some cases, the set of tethers prevent the proof mass from being displaced in the second direction and the third direction. In this way, proof mass assembly 16 may only allow the proof mass to be displaced along a single axis (e.g., a displacement axis). Because the displacement of the proof mass may determine the acceleration measured by circuit 14, system 10 may be configured to determine the acceleration relative to the displacement axis.

In some examples, the first positive feedback loop (e.g., device 12, proof mass assembly 16, EOM 22A, photoreceiver 24A, feedback unit 26A, and frequency counter 28A) and the second positive feedback loop (e.g., light-emitting device 12, proof mass assembly 16, EOM 22B, photoreceiver 24B, feedback unit 26B, and frequency counter 28B) are configured to independently determine an acceleration value representative of an acceleration of an object including system 10. For example, light-emitting device 12 may emit an optical signal, EOM 22A may modulate the optical signal to obtain a first modulated optical signal, and EOM 22A may transmit the first modulated optical signal to proof mass assembly 16. Photoreceiver 24A may receive the first modulated optical signal from proof mass assembly 16, where properties of the first modulated optical signal received by photoreceiver 24A may be affected by mechanical vibrations of a first DETF structure of proof mass assembly 16. Photoreceiver 24A converts the first modulated optical signal into a first electrical signal and transmits the first electrical signal to feedback unit 26A.

In some examples, feedback unit 26A processes the first electrical signal to obtain a first processed electrical signal. For example, feedback unit 26A may use any combination of a first band pass filter, a first phase shifter, a first electronic amplifier, and a first voltage limiter to process the first electrical signal. Frequency counter 28A may receive the first processed electrical signal and determine a first frequency value corresponding to the first processed electrical signal. In some cases, the first frequency value represents a mechanical vibration frequency of the first DETF structure of proof mass assembly 16, which carries the first modulated optical signal ultimately received by photoreceiver 24A.

In addition to transmitting the first processed electrical signal to frequency counter 28A, feedback unit 26A may transmit the first processed electrical signal to EOM 22A. In turn, EOM 22A may modulate the optical signal emitted by light-emitting device 12 based on the first processed electrical signal, where the first modulated optical signal is transmitted to photoreceiver 24A via the first DETF structure of proof mass assembly 16, thus completing the first positive feedback loop. As such, a future mechanical vibration frequency of the first DETF structure depends, at least in part, on a current mechanical vibration frequency of the first DETF structure.

Additionally, in some examples, the second positive feedback loop may determine a second frequency value. For example, light-emitting device 12 may emit an optical signal, EOM 22B may modulate the optical signal to obtain a second modulated optical signal, and EOM 22B may transmit the second modulated optical signal to proof mass assembly 16. Photoreceiver 24B may receive the second modulated optical signal from proof mass assembly 16, where properties of the second modulated optical signal received by photoreceiver 24B may be affected by mechanical vibrations of a second DETF structure of proof mass assembly 16. Photoreceiver 24B converts the second modulated optical signal into a second electrical signal and transmits the second electrical signal to feedback unit 26B.

In some examples, feedback unit 26B processes the second electrical signal to obtain a second processed electrical signal. For example, feedback unit 26B may use any combination of a second band pass filter, a second phase shifter, a second electronic amplifier, and a second voltage limiter to process the second electrical signal. Frequency counter 28B may receive the second processed electrical signal and determine a second frequency value corresponding to the second processed electrical signal. In some cases, the second frequency value represents a mechanical vibration frequency of the second DETF structure of proof mass assembly 16, which carries the second modulated optical signal ultimately received by photoreceiver 24B.

In addition to transmitting the second processed electrical signal to frequency counter 28B, feedback unit 26B may transmit the second processed electrical signal to EOM 22B. In turn, EOM 22B may modulate the optical signal emitted by light-emitting device 12 based on the second processed electrical signal, where the second modulated optical signal is transmitted to photoreceiver 24B via the second DETF structure of proof mass assembly 16, thus completing the second positive feedback loop. As such, a future mechanical vibration frequency of the second DETF structure depends, at least in part, on a current mechanical vibration frequency of the second DETF structure.

Processing circuitry 30 may be configured to calculate, based on the first frequency value, a first acceleration value. In some examples, to calculate the first acceleration value, processing circuitry 30 may subtract a baseline frequency value from the first frequency value to obtain a first frequency difference value. The baseline frequency value may represent a resonant mechanical frequency of the first DETF structure of proof mass assembly 16 while the proof mass is not displaced from a resting point along the proof mass displacement axis. In other words, the modulated optical signal emitted by EOM 22A may induce the first DETF structure to vibrate at the baseline frequency value while the proof mass is not displaced from the resting point along the proof mass displacement axis. As such, when the object is not accelerating, the first frequency difference value may be equal to zero since the first acceleration value—which represents the mechanical frequency of the first DETF structure—is equal to the baseline frequency value when the proof mass is not displaced (e.g., the object carrying system 10 is not accelerating). The first frequency difference value, in some examples, may be correlated with an acceleration of the object. In other words, an increase of a magnitude of the first frequency difference value may indicate an increase in the acceleration of the object and a decrease of a magnitude of the first frequency difference value may indicate decrease in the acceleration of the object.

Additionally, processing circuitry 30 may be configured to calculate a second acceleration value based on the second acceleration value. In some examples, to calculate the second acceleration value, processing circuitry 30 may subtract a baseline frequency value from the second frequency value to obtain a second frequency difference value. The second frequency difference value, in some examples, may be correlated with an acceleration of the object. In other words, an increase of a magnitude of the second frequency difference value may indicate an increase in the acceleration of the object and a decrease of a magnitude of the second frequency difference value may indicate decrease in the acceleration of the object. The first acceleration value and the second acceleration value, which are calculated by processing circuitry 30, may, in some cases, be approximately equal.

In some examples, system 10 includes an opto-mechanical vibrating beam accelerometer as a self-oscillating electro-opto-mechanical oscillator. Two pairs of nanoscale dielectric beams may form a pair of DETF structures that rigidly anchor a thin film proof mass to a frame. Each DETF structure of the pair of DETF structures may have an optical resonance with a spectral width within a range bounded inclusively by 0.05 nanometers (nm) and 1 nm (e.g., 0.1 nm). In some examples, the DETF structures may be excited and driven by the optical signal emitted by light-emitting device 12, where the optical signal is coupled into an optically active portion of the DETF structures via a waveguide. Mechanical motion of the DETF structures, driven by the amplitude-modulated optical signal, may have a reciprocal effect on the optical signal in that the mechanical motion modulates the optical signal. In other words, an optical signal may both induce mechanical vibration in the DETF structures and measure a mechanical vibration frequency of the DETF structures corresponding to the vibration caused by the optical signal.

The optical signal may be outcoupled from the DETF structures. In some examples, the laser field is reflected out of the DETF structures. In some examples, the optical signal passes through the DETF structures in transmission and the optical signal is incident on photoreceivers 24 with suitable bandwidth to detect an Alternating Current (AC) photocurrent at the modulation frequency of the optical signal. The electrical signals produced by photoreceivers 24 may be conditioned by the feedback electronics (e.g., filtered, amplified, phase shifted, and voltage limited) and the electrical signals are output to respective drive ports of EOMs 22 to modulate the optical signal. In this way, system 10 may realize closed loop electro-opto-mechanical self-oscillation at a mechanical resonance frequency (e.g., 1.33 megahertz (MHz)) under standard conditions of positive feedback with 0 degrees phase shift and 0 dB round-trip signal gain, Accelerations experienced by system 10 may cause minute displacements of the proof mass of proof mass assembly 16, generating stresses in the DETF structures which shift mechanical resonance frequencies of the DETF structures—higher for tensile stresses, lower for compressive stresses. As such, an instantaneous frequency of each DETF structure may be monitored by counting the frequency of a respective electrical signal using a frequency counters 28. To generate an acceleration value, processing circuitry 30 may apply, in some examples, scale factors to measured frequency shifts in mechanical vibrating frequencies of the DETF structures.

Figure 2:
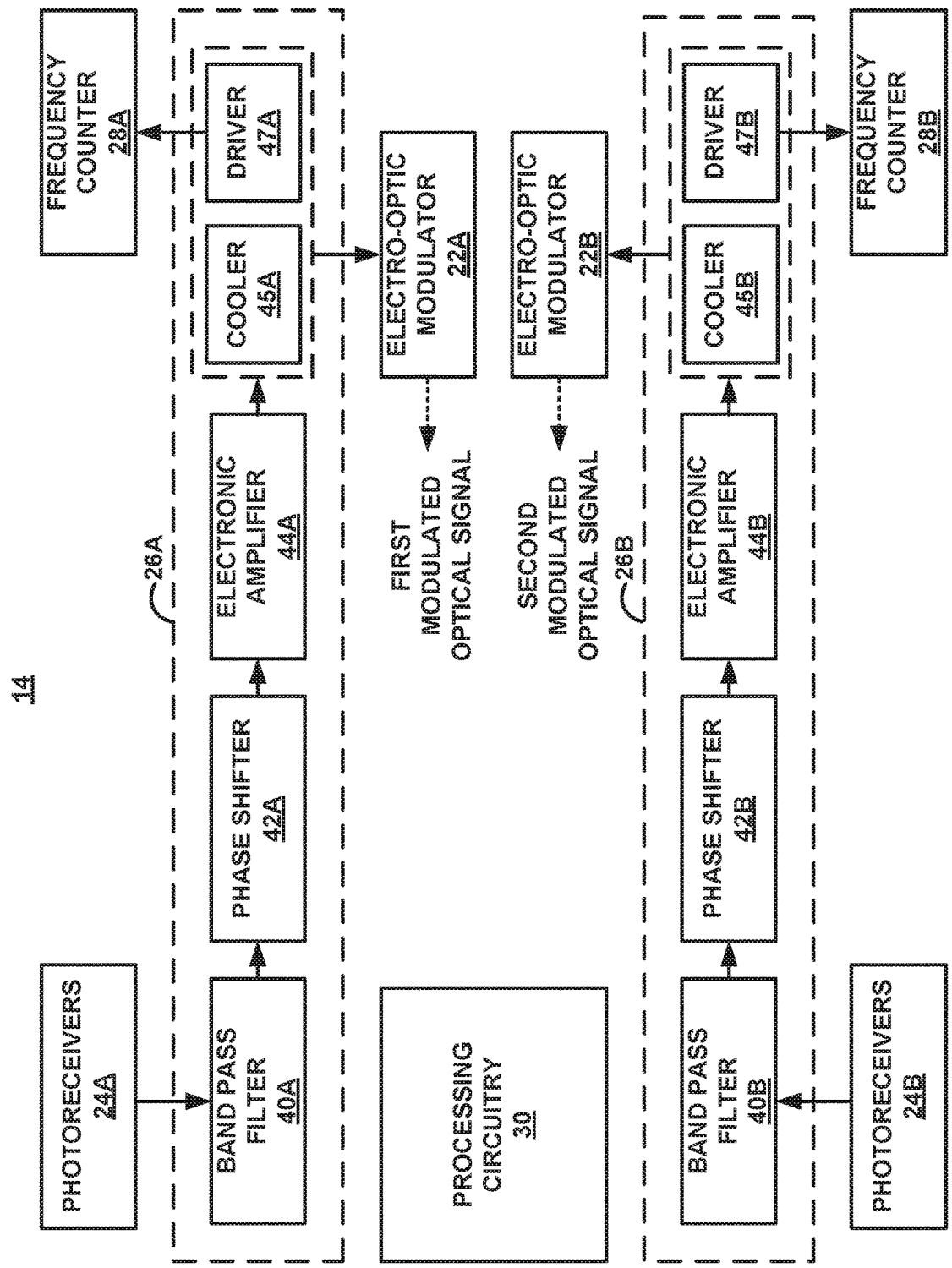
FIG. 2 is a block diagram illustrating the circuit of FIG. 1 in further detail, in accordance with one or more techniques of this disclosure.

FIG. 2 is a block diagram illustrating circuit 14 of FIG. 1 in further detail, in accordance with one or more techniques of this disclosure. As illustrated in FIG. 1, circuit 14 includes EOMs 22, photoreceivers 24, feedback units 26, frequency counters 28, and processing circuitry 30. Feedback units 26 may each include band pass filters 40A, 40B (collectively, "band pass filters 40"), phase shifters 42A, 42B (collectively, "phase shifters 42"), electronic amplifiers 44A, 44B (collectively, "electronic amplifiers 44"), coolers 45A, 45B (collectively, "coolers 45"), and drivers 47A, 47B (collectively, "drivers 47"). The first feedback loop includes band pass filter 40A, phase shifter 42A, electronic amplifier 44A, cooler 45A, and driver 47A). The second feedback loop includes band pass filter 40B, phase shifter 42B, electronic amplifier 44B, cooler 45B, and driver 47B.

Circuit 14 may be configured to configured to receive modulated optical signals from proof mass assembly 16, convert the optical signals into electrical signals, process the electrical signals, analyze the processed electrical signals to determine acceleration values, and use the processed electrical signals to modulate optical signals, thus completing the first feedback loop and the second feedback loop. For example, photoreceivers 24A may receive a first modulated optical signal from a first DETF structure of proof mass assembly 16. The first modulated optical signal may include a frequency component associated with the first DETF structure itself, such as a vibration frequency of the first DETF structure. Photoreceivers 24A may convert the first modulated optical signal into a first electrical signal, preserving the frequency component indicative of the vibration frequency of the first DETF structure for cooler 45A and a second electrical signal for driver 47A. Photoreceivers 24A may transmit the first electrical signal and the second electrical signal to feedback unit 26A, which includes band pass filter 40A, phase shifter 42A, electronic amplifier 44A, cooler 45A, and driver 47A.

Band pass filter 40A may be an electronic filter that attenuates frequencies outside of a frequency range and "passes" frequencies within the frequency range. In some examples, band pass filter 40A includes any combination of passive filters, active filters, infinite impulse response (IIR) filters, finite impulse response (FIR) filters. Butterworth filters, Chebyshev filters, elliptic filters. Bessel filters, Gaussian filters, Legendre filters, or Linkwitz-Riley filters. In some examples, band pass filter 40A includes a combination of a high pass filter which passes frequencies above a high pass cutoff point and a low pass filter which passes frequencies below a low pass cutoff point. In some cases, band pass filter 40A passes frequencies within a range between 100 kilohertz (kHz) and 10,000 kHz.

Phase shifter 42A may be configured to shift a phase of the first electrical signal and the second electrical signal. Phase may be characterized as a position of an instant on a waveform cycle of a periodic waveform. For example, the first electrical signal may include periodic waveforms which represent frequency components of the first electrical signal. A maximum peak of a sine wave for example, may be at a different phase than a minimum peak, or a zero crossing of the sine wave. In some examples, phase shifter 42A may "delay" the first electrical signal by a time value in order to shift a timeline in which frequency components of the first electrical signal oscillate and delay the second electrical signal by a time value in order to shift a timeline in which frequency components of the second electrical signal oscillate.

Electronic amplifier 44A may amplify the first electrical signal and/or the second electrical signal such that an amplitude of the first electrical signal is increased by a gain factor. In other words, electronic amplifier 44A may increase a power of the first electrical signal and second electrical signal. By amplifying the first electrical signal and second electrical signal using electronic amplifier 44A, circuit 14 may improve an ability of processing circuitry 30 to analyze the first electrical signal and the second electrical signal, and modulate the optical signal emitted by light-emitting device 12 using EOM 22A.

Electronic amplifier 44A may include, in some cases, power amplifiers, operational amplifiers, or transistor amplifiers, or any combination thereof. Additionally, in some examples, electronic amplifier 44A is configured to limit a voltage of the first electrical signal and/or second electrical signal to a maximum voltage value. In other words, electronic amplifier 44A may prevent the first electrical signal and the second electrical signal from exceeding the maximum voltage value, meaning that the first processed electrical signal and the second processed electrical signal produced by feedback unit 26A may not exceed the maximum voltage value.

In some examples, the first electrical signal and the second electrical signal may pass through feedback unit 26A in an order from band pass filter 40A, to phase shifter 42A, to electronic amplifier 44A, and to cooler 45A and driver 47A, as illustrated in FIG. 1. However, the order illustrated in FIG. 1 is not limiting. Band pass filter 40A, phase shifter 42A, and electronic amplifier 44A may be arranged to process the first electrical signal and second first electrical signal in any order.

Cooler 45A may be configured to cause EOM 22A to apply a cooling feedback that is 180 degrees out of phase with noise fluctuations due to temperature to mitigate the effects of thermal noise on proof mass assembly 16. For example, cooler 45A may be configured to generate a cooling feedback signal that causes EOM 22A to cancel 20 dB of the optical signal. For example, cooler 45A may generate the cooling feedback signal to apply a 0 dB gain that is 180 degrees out of phase with noise fluctuations.

Driver 47A may be configured to cause EOM 22A to drive the optical signal to a mechanical resonance of proof mass assembly 16. For example, driver 47A may be configured to generate a mechanical resonance feedback signal that causes EOM 22A to operate near or at the mechanical resonance of proof mass assembly 16. For example, driver 47A may generate the mechanical resonance feedback signal using a signal generator set to the mechanical resonance of proof mass assembly 16.

Feedback unit 26A may transmit the first processed electrical signal to frequency counter 28A. Frequency counter 28A may determine a first frequency value, and processing circuitry 30 may determine a first acceleration value based on the first frequency value. Additionally, feedback unit 26A may combine and transmit the first processed electrical signal and the second processed electrical signal to EOM 22A and EOM 22A may modulate the optical signal emitted by light-emitting device 12 based on the first processed electrical signal and the second processed electrical signal. In this way, proof mass assembly 16, photoreceiver 24A, band pass filter 40A, phase shifter 42A, electronic amplifier 44A, cooler 45A, driver 47A, EOM 22A, and frequency counter 28A are a part of the first positive feedback loop which produces the first acceleration value associated with the object including system 10.

The components of feedback unit 26B (e.g., band pass filter 40B, phase shifter 42BN, electronic amplifier 44B, cooler 45B, and driver 47B) may be substantially similar to the respective components of feedback unit 26A. As such, the second positive feedback loop may be substantially similar to the first positive feedback loop.

Figure 3:
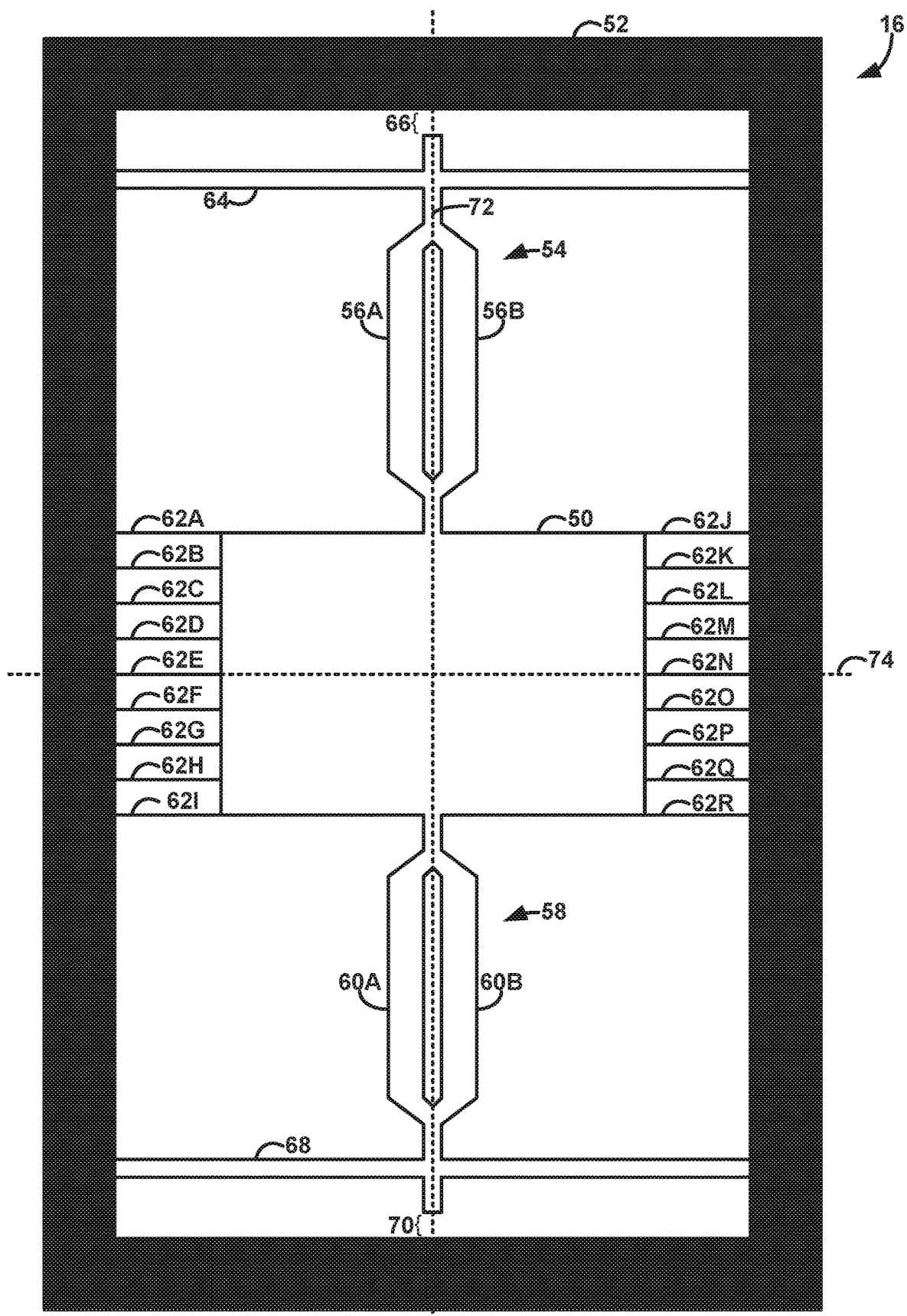
FIG. 3 illustrates a conceptual diagram of the proof mass assembly of FIG. 1 including a proof mass suspended within a frame by a first doubled ended tuning fork (DETF) structure, a second DETF structure, and a set of tethers, in accordance with one or more techniques of this disclosure.

FIG. 3 illustrates a conceptual diagram of proof mass assembly 16 including a proof mass 50 suspended within a frame 52 by a first DETF structure 54, a second DETF structure 58, and a set of tethers 62A-62R, in accordance with one or more techniques of this disclosure. As illustrated in FIG. 3, proof mass assembly 16 includes proof mass 50, frame 52, first DETF structure 54 including a first pair of mechanical beams 56A, 56B (collectively, "first pair of mechanical beams 56"), second DETF structure 58 including a second pair of mechanical beams 60A, 60B (collectively, "second pair of mechanical beams 60"), tethers 62A-62R (collectively, "tethers 62"), first distal tine 64, and second distal tine 68. Proof mass assembly 16 is aligned relative to proof mass displacement axis 72 and proof mass resting plane 74, as illustrated in FIG. 3.

Proof mass assembly 16 is a mechanical component of electro-opto-mechanical system 10. Because system 10 measures acceleration, which is a rate in which a velocity of an object changes over time, it may be beneficial to include proof mass assembly 16 so that acceleration can be measured based on a physical object such as proof mass 50. For example, system 10, which includes proof mass assembly 16 may be fixed to or included within an object. Consequently, as the object accelerates at an acceleration value, proof mass assembly 16 may also accelerate at the acceleration value. Acceleration may affect a position of proof mass 50 within frame 52 relative to proof mass displacement axis 72 and proof mass resting plane 74. For example, non-zero acceleration may cause proof mass 50 to be displaced from proof mass resting plane 74 along proof mass displacement axis 72. As described herein, if proof mass 50 is "displaced," a center of mass of proof mass 50 is displaced relative to frame 52. Increasing a magnitude of acceleration may cause the displacement of proof mass 50 along proof mass displacement axis 72 to increase. Additionally, decreasing a magnitude of acceleration may cause the displacement of proof mass 50 along proof mass displacement axis 72 to decrease.

In some examples, proof mass 50 take the form of a patterned thin film, where the thin film has a mass within a range between 100 nanograms (ng) and 10,000 ng. Additionally, in some cases, the thin film has a thickness within a range between 1 nm and 5,000 nm. Proof mass 50 may be suspended within frame 52 along proof mass displacement axis 72 by first DETF structure 54 and second DETF structure 58 (collectively, "DETF structures 54, 58"). First DETF structure 54 and second DETF structure 58 may each have a high level of stiffness. For example, a scale factor of each of first DETF structure 54 and second DETF structure 58 may be within a range between 0.1 parts per million per gram (ppm/g) and 10 ppm/g. In this way, proof mass assembly 16 may include a very light proof mass 50 which is secured by very stiff DTEF structures 54, 58. As such, a very high acceleration (e.g., 100,000 m/s$^2$) may cause proof mass 50 to be displaced along the proof mass displacement axis 72 by a very small displacement value, for example. In some examples, proof mass 50 is displaced along the proof mass displacement axis 72 by a displacement value of up to 100 nm.

To generate acceleration values indicative of the acceleration of the object in which system 10 is fixed to, system 10 may quantify, using optical signals, the displacement of proof mass 50 within frame 52. To quantify the displacement of proof mass 50, system 10 may measure and analyze mechanical properties of DETF structures 54, 58, such as mechanical vibrating frequency values corresponding to DETF structures 54, 58. Indeed, since DETF structures 54, 58 suspend proof mass 50, the mechanical vibrating frequencies of DETF structures 54, 58 may be affected due to a displacement of proof mass 50. For example, a displacement of proof mass 50 towards first DETF structure 54 and away from second DETF structure 58 may cause proof mass 50 to apply a compression force to first DETF structure 54 and apply a tension force to second DETF structure 58. Such a compression force may cause the mechanical vibration frequency of first DETF structure 54 to decrease and such a tension force may cause the mechanical vibration force of second DETF structure 58 to increase. Changes in the mechanical vibration frequencies of DETF structures 54, 58 may, in some examples, be proportional to the displacement of proof mass 50 relative to frame 52 in the direction of proof mass displacement axis 72. In some examples, System 10 may measure changes in the mechanical vibration frequencies of DETF structures 54, 58 by transmitting modulated optical signals through DETF structures 54, 58.

First DETF structure 54 may include, for example, the first pair of mechanical beams 56 separated by a gap. The first pair of mechanical beams 56 may include photonic crystal mechanical beams that are configured for carrying a first modulated optical signal while first DETF structure 54 is oscillating at a first mechanical vibrating frequency. In some cases, the first modulated optical signal is emitted by light-emitting device 12 (illustrated in FIG. 1), and the first modulated optical signal itself induces vibration in first DETF structure 54. Additionally, the vibration of the first DETF structure 54 may affect certain properties of the first modulated optical signal such that the mechanical vibrating frequency of the first DETF structure 54 is reflected in the first modulated optical signal. In this way, the first modulated optical signal may cause the mechanical vibration in the first DETF structure 54 and enable system 10 to measure the mechanical vibration frequency of the first DETF structure 54 based on the first modulated optical signal.

Additionally, second DETF structure 58 may include, for example, the second pair of mechanical beams 60 separated by a gap. The second pair of mechanical beams 60 may include photonic crystal mechanical beams that are configured for carrying a second modulated optical signal while second DETF structure 58 is oscillating at a second mechanical vibrating frequency. In some cases, the second modulated optical signal is emitted by light-emitting device 12 (illustrated in FIG. 1), and the second modulated optical signal itself induces vibration in second DETF structure 58. Additionally, the vibration of the second DETF structure 58 may affect certain properties of the second modulated optical signal such that the mechanical vibrating frequency of the second DETF structure 58 is reflected in the second modulated optical signal. In this way, the second modulated optical signal may cause the mechanical vibration to occur in the second DETF structure 58 and enable system 10 to measure the mechanical vibration frequency of the second DETF structure 58 based on the second modulated optical signal.

Proof mass 50 may be fixed to frame 52 by tethers 62. In some examples, tethers 62 may suspend proof mass 50 in proof mass resting plane 74 such that the center of mass of proof mass 50 does not move within proof mass resting plane 74 relative to frame 52. Proof mass displacement axis 72 may represent a single axis (e.g., x-axis) of a Cartesian space, and proof mass resting plane 74 may represent two axes (e.g., y-axis and z-axis) of the Cartesian space. Since tethers 62 may restrict proof mass 50 from being displaced relative to proof mass resting plane 74, in some examples, proof mass 50 may only be displaced along the proof mass displacement axis 72. System 10 may measure an acceleration based on mechanical vibrating frequencies of DETF structures 54, 58, where the mechanical vibrating frequencies are related to an amount of displacement of proof mass 50 along proof mass displacement axis 72. In this way, the acceleration determined by system 10 may be an acceleration relative to proof mass displacement axis 72.

First DETF structure 54 may include a proximal end that is proximate to proof mass 50, and a distal end that is separated from frame 52 by a first gap 66. First distal tine 64 may help to suspend first DETF structure 54 within frame 52 such that the first DETF structure 54 is perpendicular to proof mass resting plane 74. In some examples, first distal tine 64 extends perpendicularly to proof mass displacement axis 72 between two sidewalls of frame 52. An optical signal may travel through frame 52 via a first optical fiber (not illustrated in FIG. 3), the optical signal being coupled across first gap 66 to first DETF structure 54.

Second DETF structure 58 may include a proximal end that is proximate to proof mass 50, and a distal end that is separated from frame 52 by a second gap 70. Second distal tine 68 may help to suspend first DETF structure 58 within frame 52 such that the second DETF structure 58 is perpendicular to proof mass resting plane 74. In some examples, second distal tine 68 extends perpendicularly to proof mass displacement axis 72 between two sidewalls of frame 52. An optical signal may travel through frame 52 via a second optical fiber (not illustrated in FIG. 3), the optical signal being coupled across second gap 70 to second DETF structure 58.

Figure 4:
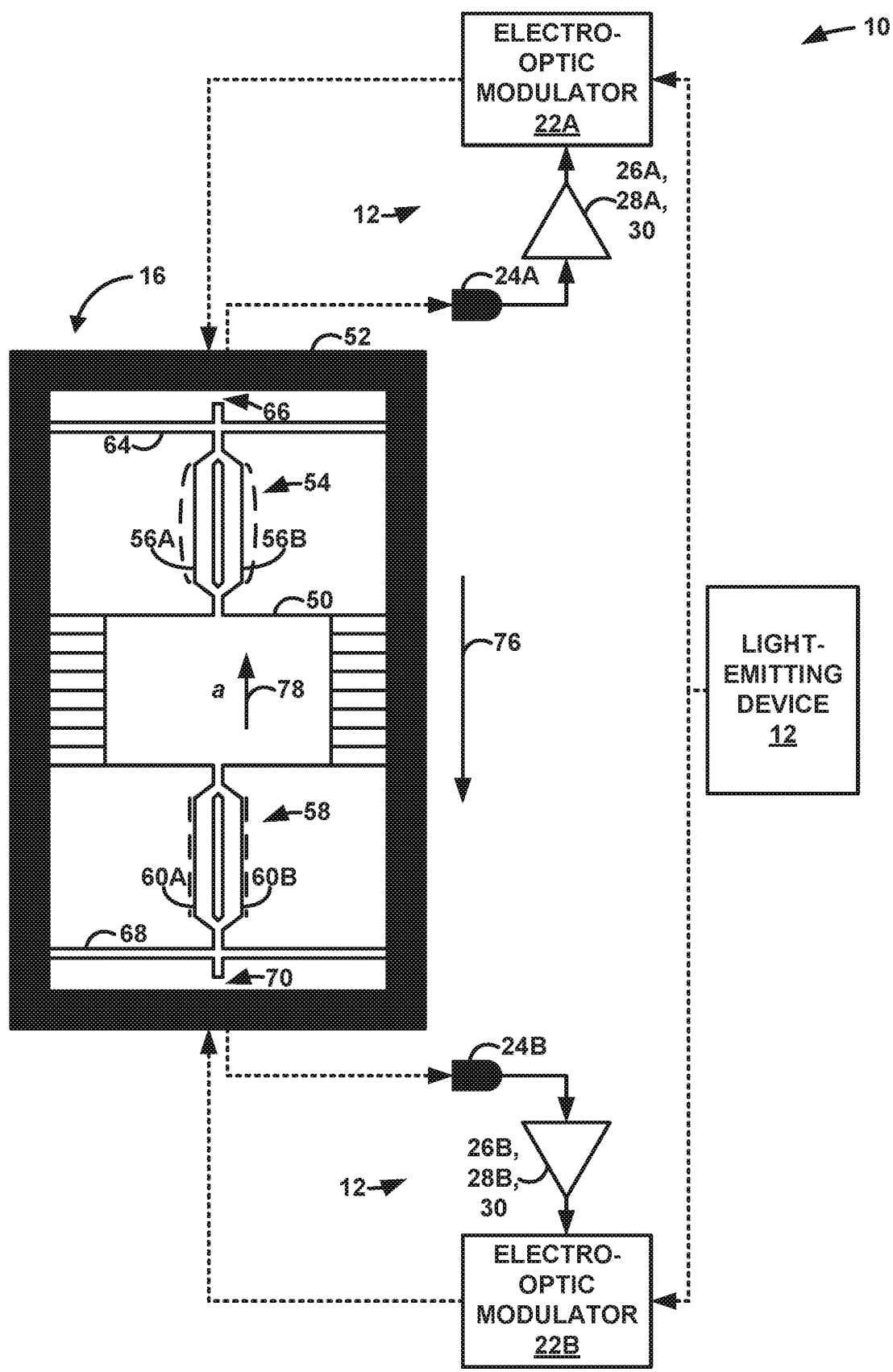
FIG. 4 illustrates a conceptual diagram of the accelerometer system of FIG. 1, in accordance with one or more techniques of this disclosure.

FIG. 4 illustrates a conceptual diagram of system 10, in accordance with one or more techniques of this disclosure. The conceptual diagram of FIG. 4 includes light-emitting device 12, components of circuit 14, and proof mass assembly 16.

In some examples, an object may be fixed to system 10. The object, in some cases, may accelerate. System 10, including proof mass assembly 16, may accelerate with the object. As proof mass assembly 16 accelerates, proof mass 50 may be displaced relative to frame 52. In the example illustrated in FIG. 4, if proof mass assembly 16 accelerates in direction 78, proof mass 50 is displaced in direction 78. Direction 78, in some examples, is aligned with a proof mass displacement axis (e.g., proof mass displacement axis 72 of FIG. 3, As proof mass 50 is displaced in direction 78 relative to frame 52, proof mass 50 applies a compression force to first DETF structure 54, and proof mass 50 applies a tension force to second DETF structure 58. Such forces may affect mechanical vibrating frequencies of DETF structures 54, 58, where mechanical vibration is induced in first DETF structure 54 and second DETF structure 58 by electro-optic modulator 22A and electro-optic modulator 22B, respectively. For example, the compression force applied to first DETF structure 54 may cause the mechanical vibration frequency of first DETF structure 54 to decrease, and the tension force applied to second DETF structure 58 may cause the mechanical vibration frequency of second DETF structure 58 to increase.

Light-emitting device 12 may emit an optical signal to EOMs 22. In turn, EOM 22A and EOM 22B may modulate the optical signal according to a first processed electrical signal produced by feedback unit 26A and a second processed electrical signal produced by feedback unit 26B, respectively. As such, EOM 22A may produce a first modulated optical signal and EOM 229 may produce a second modulated optical signal. EOM 22A, for example, may transmit the first modulated optical signal to proof mass assembly 16. The first modulated optical signal may cross frame 52. In some examples, frame 52 includes an aperture or another opening bridged by a first optical fiber which allows the first modulated optical signal to pass. Additionally, the first modulated optical signal may couple across first gap 66 to the first DETF structure 54. The first modulated optical signal may propagate through first DETF structure 54, inducing mechanical vibration in first DETF structure 54. In some examples, the first modulated optical signal propagates the length of first DETF structure 54 towards proof mass 50 along mechanical beam 56A and subsequently propagates the length of first DETF structure 54 away from proof mass 50 along mechanical beam 56B. In some examples, the first modulated optical signal propagates the length of first DETF structure 54 towards proof mass 50 along mechanical beam 56B and subsequently propagates the length of first DE structure 54 away from proof mass 50 along mechanical beam 56A. In any case, by propagating the length of first DETF structure 54, the first modulated optical signal may retain information indicative of mechanical properties (e.g., the mechanical vibration frequency) of first DETF structure 54. After the first modulated optical signal propagates through first DETF structure 54, the first modulated optical signal may exit proof mass assembly 16 via first gap 66 and the first optical fiber of frame 52.

After exiting proof mass assembly 16, the first modulated optical signal, which may include thermal noise, may arrive at photoreceiver 24A. Photoreceivers 24A convert the first modulated optical signal into a first electrical signal for cooling the thermal noise and a second electrical signal for driving EOM 22A to a mechanical resonance of proof mass assembly 16. Frequency counter 28A may determine a first frequency value corresponding to the first processed electrical signal, where the first frequency value is indicative of the mechanical vibrating frequency of the first DETF structure 54. Processing circuitry 30 may subtract a baseline frequency value from the first frequency value to obtain a first frequency difference value and calculate a first acceleration value based on the first frequency difference value. EOM 22A may use the first processed electrical signal to modulate the optical signal emitted by light-emitting device 12.

EOM 228, for example, may transmit the second modulated optical signal to proof mass assembly 16. The second modulated optical signal may cross frame 52. In some examples, frame 52 includes an aperture or another opening bridged by a second optical fiber which allows the second modulated optical signal to pass. Additionally, the second modulated optical signal may couple across second gap 70 to the second DETF structure 58. The second modulated optical signal may propagate through second DETF structure 58, inducing mechanical vibration in second. DETF structure 58. In some examples, the second modulated optical signal propagates the length of second DETF structure 58 towards proof mass 50 along mechanical beam 60A and subsequently propagates the length of second DETF structure 58 away from proof mass 50 along mechanical beam 609. In some examples, the second modulated optical signal propagates the length of second DETF structure 58 towards proof mass 50 along mechanical beam 60B and subsequently propagates the length of second DETF structure 58 away from proof mass 50 along mechanical beam 60A. In any case, by propagating the length of second DETF structure 58, the second modulated optical signal may retain information indicative of mechanical properties (e.g., the mechanical vibration frequency) of second DETF structure

58. After the second modulated optical signal propagates through second DETF structure 58, the second modulated optical signal may exit proof mass assembly 16 via second gap 70 and the second optical fiber of frame 52.

After exiting proof mass assembly 16, the second modulated optical signal, which may include thermal noise, may arrive at photoreceivers 24B. Photoreceivers 24B convert the second modulated optical signal into a first electrical signal for cooling the thermal noise and a second electrical signal for driving EOM 22B to a mechanical resonance of proof mass assembly 16. Frequency counter 28B may determine a second frequency value corresponding to the second processed electrical signal, where the second frequency value is indicative of the mechanical vibrating frequency of the second DETF structure 58. Processing circuitry 30 may subtract a baseline frequency value from the second frequency value to obtain a second frequency difference value and calculate a second acceleration value based on the second frequency difference value. EOM 228 may use the second processed electrical signal to modulate the optical signal emitted by light-emitting device 12.

Figure 5:
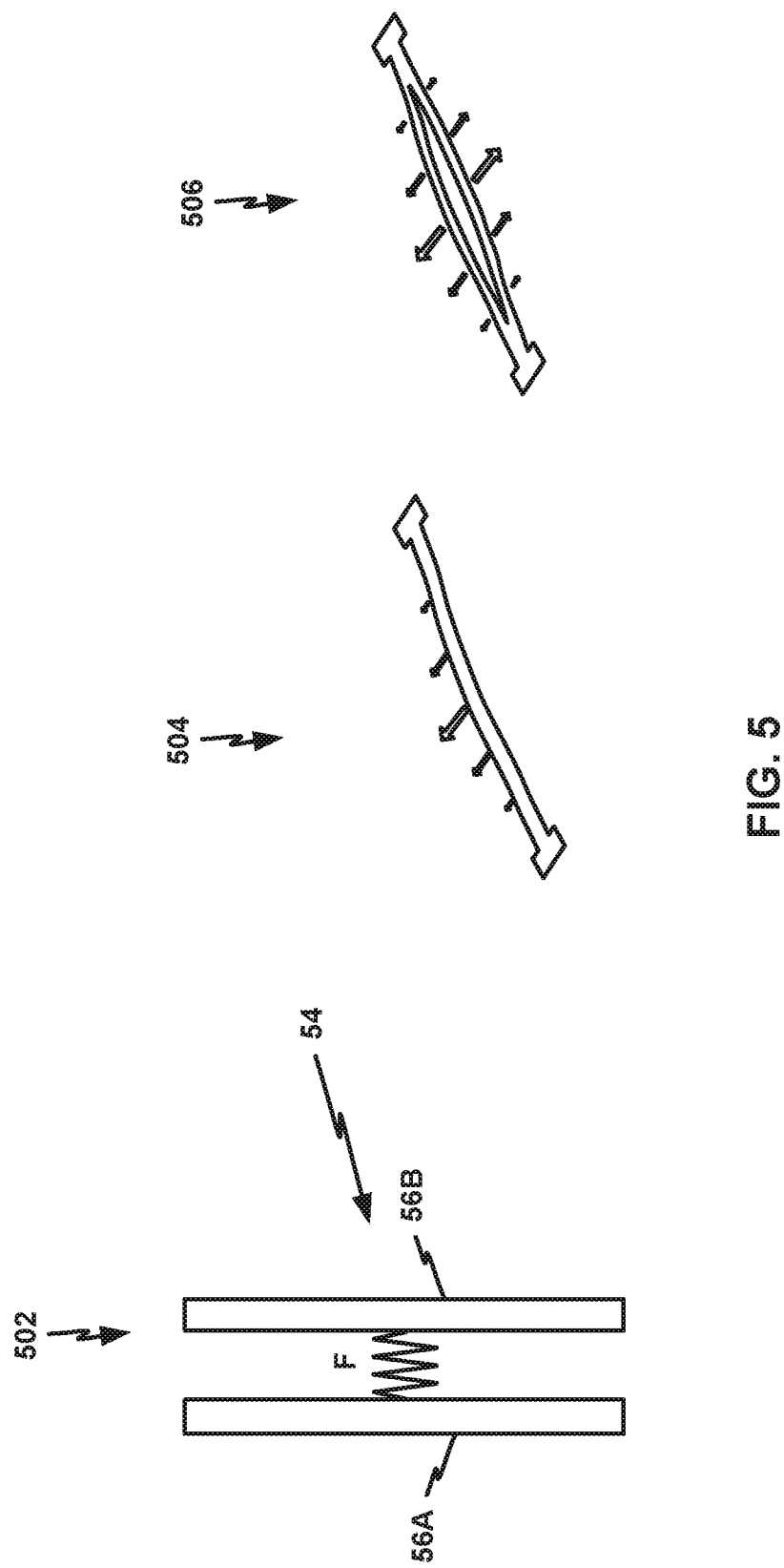
FIG. 5 depicts additional aspects of the accelerometer system of FIG. 1, in accordance with one or more techniques of this disclosure.

FIG. 5 depicts additional aspects of system 10, in accordance with one or more techniques of this disclosure. For example, FIG. 5 illustrates the first DETF structure 54 including the first pair of mechanical beams 56. The optical signal emitted by light-emitting device 12 may induce a force between the first pair of mechanical beams 56, and the force may be modelled by a spring force. FIG. 5 illustrates a spring force provided by laser light between beams in an optical zipper in the gap between photonic crystal mechanical beams 56A, 56B of DETF structure 54 (502); a perspective view depiction of vibration modes in beams in an optical zipper in one common direction together (504); and a perspective view depiction of vibration modes in beams in an optical "zipper" in opposing directions of oscillation (506).

Figure 6:
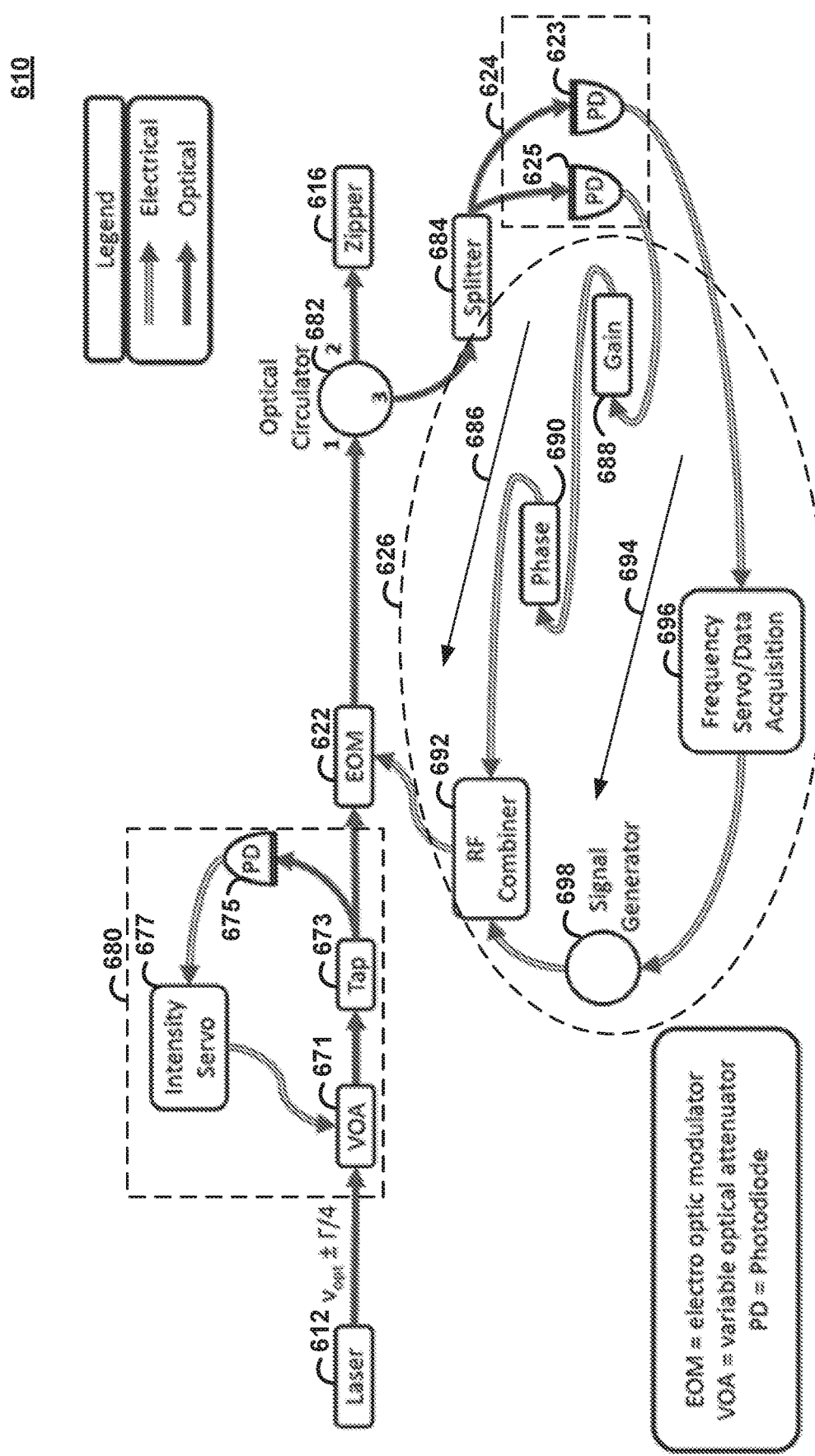
FIG. 6 is a conceptual diagram illustrating an example process for cooling a mechanical temperature of an optomechanical device, in accordance with one or more techniques of this disclosure.

FIG. 6 is a conceptual diagram illustrating an example process for cooling the mechanical temperature of an opto-mechanical device, in accordance with one or more techniques of this disclosure. As shown, electro-opto-mechanical system 610, which may be an example of electro-opto-mechanical system 10, may include light-emitting device 612 (also referred to herein as simply "laser 612"), intensity stabilizer 680, EOM 622, optical circulator 682, proof mass assembly 616 (also referred to herein as "zipper"), photoreceivers 624, feedback unit 626, and splitter 684. As shown, photoreceivers 624 may include photoreceivers 625 (also referred to herein as "photodiodes 625") and photoreceivers 623 (also referred to herein as "photodiodes 623").

Light-emitting device 612, which may be an example of light-emitting device 12, provides light (e.g., an optical signal) near an optical resonance of proof mass assembly 616. For example, light-emitting device 612 may be configured to emit the optical signal having an optical frequency driven to an optical resonance frequency of proof mass assembly 616 plus a quarter of the Full Width at Half Maximum (FWHM) of the optical resonance. In some examples, light-emitting device 612 may be configured to emit the optical signal having an optical frequency driven to an optical resonance frequency of proof mass assembly 616 minus a quarter of the FWHM of the optical resonance. That is, the optical frequency may be driven at either $v_{opt} \pm \Gamma/4$, where $v_{opt}$ is the optical resonance frequency and $\Gamma$ is the FWHM of the optical resonance.

An intensity stabilizer 680 stabilizes the light intensity. For example, intensity stabilizer 680 may regulate the light intensity of an optical signal output by the intensity stabilizer 680 to a predetermined light intensity value. As shown, intensity stabilizer 680 may include Variable Optical Attenuator 671 ("VOA 671"), tap 673, photoreceiver 675 (also referred to herein as "photodiode 675" or simply "PD 675"), and intensity servo 677. VOA 671 may be configured to attenuate the light intensity of the optical signal output by laser 612 based on an electrical control signal output by intensity servo 677. Tap 673 may be configured to split the optical signal after attenuation to proceed into EOM 622 and to photodiode 675. Photoreceiver 675 generates an indication of the light intensity of the optical signal after attenuation by VOA 671. Intensity servo 677 generates the electrical control signal output to drive VOA 671 to stabilize the light intensity of the optical signal output to EOM 622. For example, intensity servo 677 generates the electrical control signal output to drive VOA 671 to stabilize the light intensity of the optical signal output to EOM 622 to a predetermined light intensity.

The light proceeds into EOM 622, which may be an example of EOM 22A. EOM 622 modulates the optical signal to a mechanical resonance while removing thermal noise using a cooling feedback signal and a mechanical resonance feedback signal output by feedback unit 626. After passing through EOM 622, the modulated optical signal passes into a first port ('1') of optical circulator 682 and out of a second port ('2') of optical circulator 682 to interact with proof mass assembly 616 and is reflected back into port 2 and then out of a third port ('3') of optical circulator 682. For example, the second port ('2') of optical circulator 682 optical circulator 682 may be configured to output the modulated optical signal to proof mass assembly 616 and receive the modulated optical signal reflected from proof mass assembly 616.

Feedback unit 626 may receive an output of the modulated optical signal reflected by proof mass assembly 616 from a third port ('3') of optical circulator 682 and generate the cooling feedback signal and the mechanical resonance feedback signal for EOM 622. As shown, feedback unit 626 may include gain module 688, phase module 690, Radio Frequency (RF) combiner 692, frequency servo and data acquisition module 696 (also referred to herein as simply "frequency servo/data acquisition module 696, and signal generator 698.

Splitter 684 may be configured to split the modulated optical signal into a first portion of the modulated optical signal and a second portion of the modulated optical signal after the modulated optical signal reflected from proof mass assembly 616. In some examples, half of the light coming from splitter 684 is used by photoreceiver 625 for cooling feedback loop 686. For example, feedback unit 626 may be configured to generate the cooling feedback signal using the first portion of the modulated optical signal. For instance, photoreceiver 625 may be configured to convert the first portion of the modulated optical signal into a first electrical signal. In some examples, feedback unit 626 may be configured to generate the mechanical resonance feedback signal using the second portion of the modulated optical signal. For instance, photoreceiver 623 may be configured to convert the second portion of the modulated optical signal into a second electrical signal.

In cooling feedback loop 686, gain module 688 and phase module 690 adjust the gain and phase, respectively, of the light from proof mass assembly 616 and RF combiner 692 feeds the resulting adjusted signal back into EOM 622 to apply a corresponding optical change back to proof mass assembly 616. For example, gain module 688 may apply a gain to the first electrical signal. The gain applied by gain module 688 may be tuned such that the total loop gain of cooling feedback loop 686 is near 0 dB. For feedback cooling, phase module 690 adjusts the total phase of the light such that the light reapplied to proof mass assembly 616 is 180 degrees out-of-phase with the light proof mass assembly 616 generates. For example, phase module 690 may adjust a phase of the electrical signal to reach 180 degrees. As such, gain module 688 and phase module 690 may be configured to generate, using the modulated optical signal, the cooling feedback signal to correspond to a thermal noise signal of the modulated optical signal with a total loop gain of zero and a phase difference of 180 degrees. In this way, proof mass assembly 616 becomes self-cooling, as cooling feedback loop 686 reapplies noise fluctuations due to temperature at proof mass assembly 616 with the opposite sign.

While cooling feedback loop 686 reduces the "temperature" of proof mass assembly 616, cooling feedback loop 686 may not provide a large enough signal-to-noise to read out acceleration (e.g., by tracking the mechanical resonance). For driving and measuring the mechanical response frequency, a narrow oscillator may provide the additional signal. Driving loop 694 may include photoreceiver 24A (also referred to herein as "photodiode 24A"), frequency servo and data acquisition module 696.

Frequency servo and data acquisition module 696 may include or perform one or more functions of frequency counter 28A. For example, frequency servo and data acquisition module 696 may be configured to measure a frequency of the mechanical resonance frequency of proof mass assembly 616 using the second electrical signal produced by photoreceiver 623. In some examples, an output of photoreceiver 623 may be processed, for example, by including one or more of band pass filter 40A, phase shifter 42A, electronic amplifier 44A, or another processing component before being processed by frequency servo and data acquisition module 696.

As shown, frequency servo and data acquisition module 696 may be configured to drive signal generator 698 using the measured frequency of the mechanical resonance to generate a drive signal at the mechanical resonance frequency of proof mass assembly 616. For example, frequency servo and data acquisition module 696 may be configured to slowly steer signal generator 698 with a frequency servo to generate a mechanical resonance feedback signal for driving the mechanical response frequency. For instance, frequency servo and data acquisition module 696 and signal generator 698 may be configured to generate, using the modulated optical signal, the mechanical resonance feedback signal to drive the mechanical response frequency of the modulated optical signal to the mechanical resonance and to measure acceleration. In some examples, frequency servo and data acquisition module 696 may be configured to track the mechanical resonance frequency to measure the acceleration.

RF combiner 692 combines the cooling feedback signal output by phase module 690 of cooling feedback loop 686 and the mechanical resonance feedback signal output by signal generator 698 and injects the combined signal into EOM 622. Cooling feedback loop 686, by virtue of the gain and phase condition, may help to cancel out the drive input by signal generator 698. However, by having finite noise cancellation (e.g. less than 15 dB of cancellation, only 20 dB of cancellation, etc.), signal generator 698 may be configured to generate the drive signal to compensates for the cancellation of the drive by cooling feedback loop 686. In this way, the finite noise cancellation of cooling feedback loop 686 may allow for substantial noise reduction while permitting a non-zero mechanical drive. The combination of cooling feedback loop 686 and driving loop 694 may allow for driving the mechanical response proof mass assembly 616 at the desired drive strength, while also reducing thermal noise of the mechanical oscillator of proof mass assembly 616. This offers a distinct advantage over attempts to directly improve the signal-to-noise of the response by driving the mechanical resonance harder, because the mechanical response of any real optomechanical device may be limited by non-linearities at higher drive strengths.

While the example of FIG. 6 describes a single feedback loop for a proof mass assembly, in some examples, the system of FIG. 6 may be configured for with more than one feedback loop, for example, but not limited to, measuring vibrations at a proof mass assembly with a DETF structure. Although FIG. 6 is described with respect to determining an acceleration value, in some examples, the cooling described in FIG. 6 may be applied to systems configured to measure velocity, vibrations, and other parameters.

Figure 7:
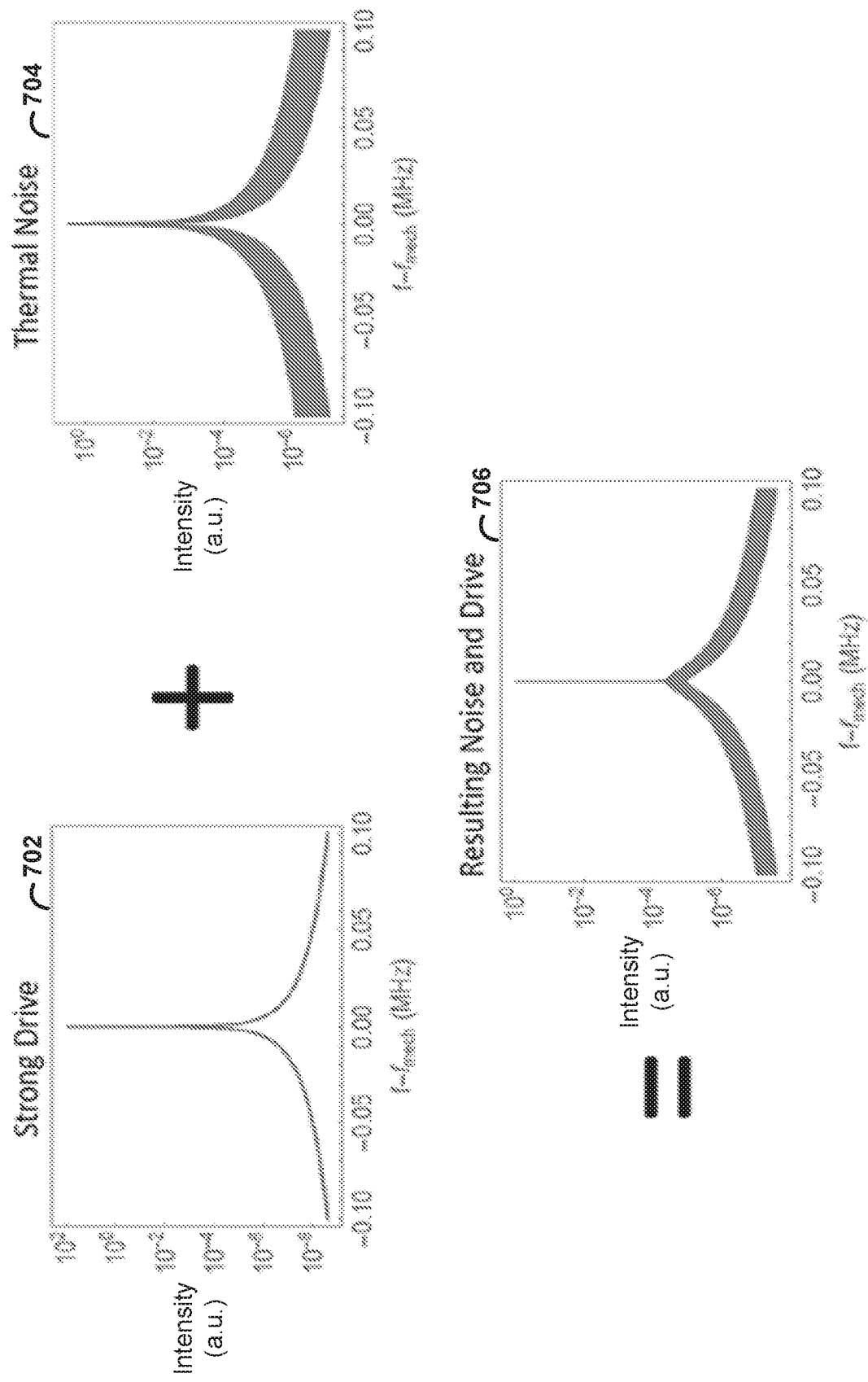
FIG. 7 is a conceptual diagram illustrating example results for cooling a mechanical temperature of an optomechanical device, in accordance with one or more techniques of this disclosure.

FIG. 7 is a conceptual diagram illustrating example results for cooling a mechanical temperature of an optomechanical device, in accordance with one or more techniques of this disclosure. In the example of FIG. 7, signal generator 698 may generate mechanical resonance feedback signal 702, which when combined with thermal noise results in drive signal with thermal noise 704. In this example, cooling feedback loop 686 reapplies noise fluctuations due to temperature at proof mass assembly 616 with the opposite sign to generate resulting noise and drive signal 706. As shown, resulting noise and drive signal 706 has been cooled compared to drive signal 702, which may result in an improved signal-to-noise compared to systems that omit cooling feedback loop 686.

Figure 8:
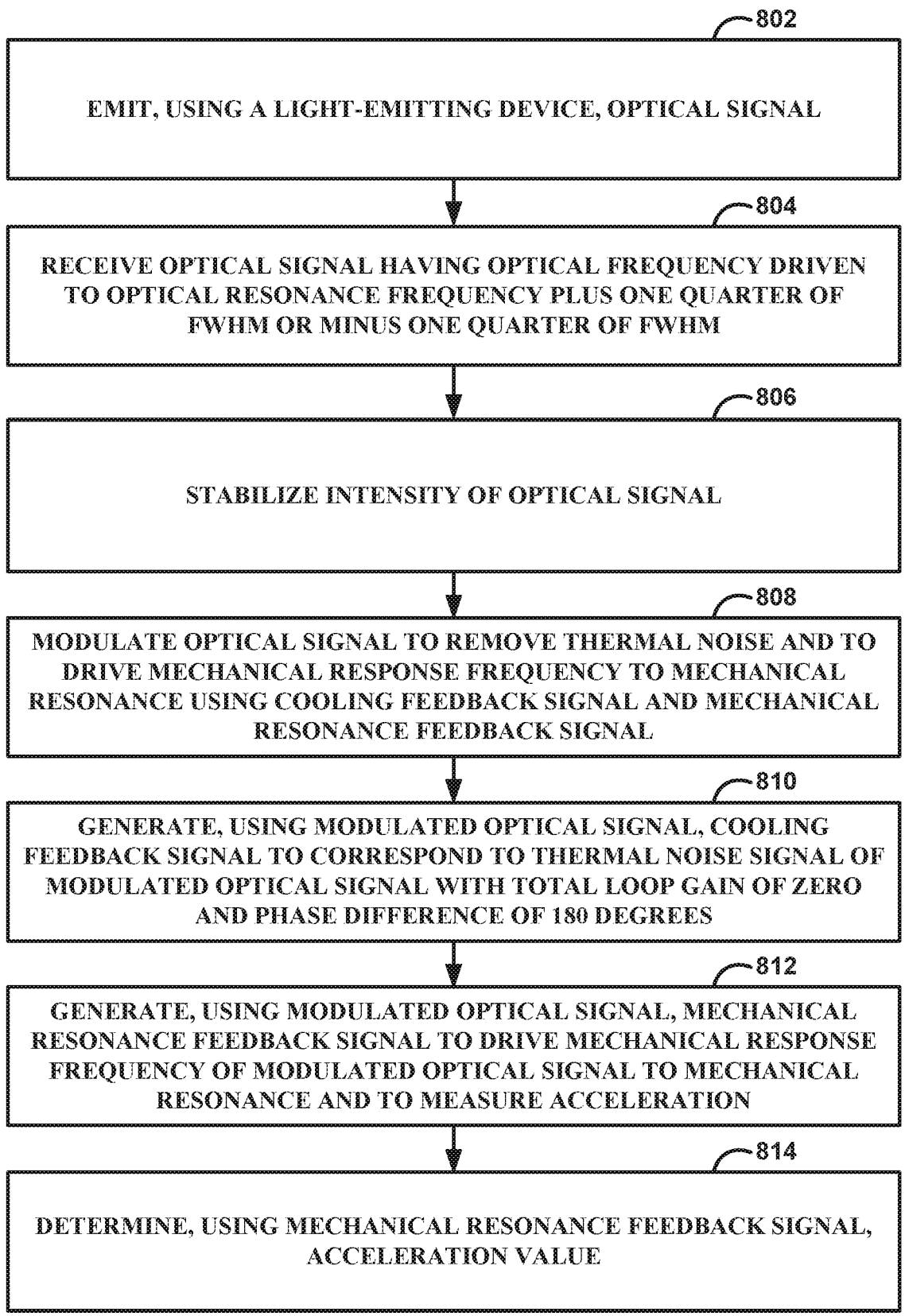
FIG. 8 is a flow diagram illustrating an example process for cooling mechanical temperature of an optomechanical device, in accordance with one or more techniques of this disclosure.

FIG. 8 is a flow diagram illustrating an example method for cooling mechanical temperature of an optomechanical device, in accordance with one or more techniques of this disclosure. For convenience, FIG. 8 is described with respect to FIGS. 1-7. However, the techniques of FIG. 8 may be performed by different components, for example, of light-emitting device 12, circuit 14, and a proof mass assembly (e.g., a single-ended tuning fork structure, a DETF structure, etc.) or by additional or alternative devices.

Light-emitting device 612 emits an optical signal (802). EOM 622 receives the optical signal having an optical frequency driven to an optical resonance frequency of plus one quarter of FWHM or minus one quarter of FWHM (804). Intensity stabilizer 680 stabilizes an intensity of the optical signal (806). For example, intensity stabilizer 680 may regulate the intensity of an optical signal output by the intensity stabilizer 680 to a predetermined light intensity value.

EOM 622 modules the optical signal to remove thermal noise and to drive a mechanical response frequency to a mechanical resonance using a cooling feedback signal and a mechanical resonance feedback signal (808). Feedback unit 626 generates, using the modulated optical signal, the cooling feedback signal to correspond to a thermal noise signal of the modulated optical signal with a total loop gain of zero and a phase difference of 180 degrees (810). Feedback unit 626 generates, using the modulated optical signal, the mechanical resonance feedback signal to drive the mechanical response frequency of the modulated optical signal to the mechanical resonance and to measure acceleration (812), Processing circuitry 30 determines, using the mechanical resonance feedback signal, an acceleration value (814). In some examples, processing circuitry 30 determines, using the mechanical resonance feedback signal, a velocity, vibration, or another value.

The optomechanical device described herein may include only analog circuitry, only digital circuitry, or a combination of analog circuitry and digital circuitry. Digital circuitry may include, for example, a microcontroller on a single integrated circuit containing a processor core, memory, inputs, and outputs. For example, digital circuitry of the optomechanical device described herein may include one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing analog circuitry and/or digital circuitry, alone or in combination with other logic circuitry, or any other equivalent circuitry.

Digital circuitry may utilize hardware, software, firmware, or any combination thereof for achieving the functions described. Those functions implemented in software may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave, Data storage media may be any available media that can be accessed by one or more computers or one or more processors to retrieve instructions, code and/or data structures for implementation of the techniques described in this disclosure.

The techniques of this disclosure may be implemented in a wide variety of devices or apparatuses that include integrated circuits (ICs) or sets of ICs (e.g., chip sets). Various components, modules, or units are described in this disclosure to emphasize functional aspects of devices configured to perform the disclosed techniques, but do not necessarily require realization by different hardware units. Rather, various units may be combined or provided by a collection of interoperative hardware units, including one or more processors as described above, in conjunction with suitable software and/or firmware

What is claimed is:

1. An optomechanical device for modulating an optical signal for reducing thermal noise and tracking mechanical resonance of a proof mass assembly, the optomechanical device comprising a circuit configured to:
   receive, from a light-emitting device, the optical signal;
   modulate the optical signal to remove thermal noise and to drive a mechanical response frequency to the mechanical resonance of the proof mass assembly using a cooling feedback signal and a mechanical resonance feedback signal;
   generate, using the modulated optical signal, the cooling feedback signal to correspond to a thermal noise signal of the modulated optical signal with a total loop gain of zero and a phase difference of 180 degrees; and
   generate, using the modulated optical signal, the mechanical resonance feedback signal to drive the mechanical response frequency of the modulated optical signal to the mechanical resonance.

2. The optomechanical device of claim 1, wherein the optical signal comprises an optical frequency driven to:
   an optical resonance frequency of the proof mass assembly plus a quarter of the fill width at half maximum (FWHM) of the optical resonance; or
   the optical resonance frequency of the proof mass assembly minus a quarter of the FWHM of the optical resonance.

3. The optomechanical device of claim 1, wherein the circuit is configured to:
   measure, using the mechanical resonance feedback signal, an acceleration at the proof mass assembly.

4. The optomechanical device of claim 1,
   wherein, to modulate the optical signal, the circuit is configured to cancel no more than 20 dB of the optical signal using the cooling feedback signal; and
   wherein, to modulate the optical signal, the circuit is configured to generate the modulated optical signal with a driving signal comprising a power of greater than 20 dB of the optical signal using the mechanical resonance feedback signal.

5. The optomechanical device of claim 1, wherein the circuit is configured to output the modulated optical signal to the proof mass assembly and receive the modulated optical signal reflected from the proof mass assembly,
   wherein, to generate the cooling feedback signal, the circuit is configured to generate the cooling feedback signal using the modulated optical signal after the modulated optical signal reflected from the proof mass assembly, and
   wherein, to generate the mechanical resonance feedback signal, the circuit is configured to generate the mechanical resonance feedback signal using the modulated optical signal after the modulated optical signal reflected from the proof mass assembly.

6. The optomechanical device of claim 5,
   wherein the circuit is configured to split the modulated optical signal into a first portion of the modulated optical signal and a second portion of the modulated optical signal,
   wherein, to generate the cooling feedback signal, the circuit is configured to generate the cooling feedback signal using the first portion of the modulated optical signal, and
   wherein, to generate the mechanical resonance feedback signal, the circuit is configured to generate the mechanical resonance feedback signal using the second portion of the modulated optical signal.

7. The optomechanical device of claim 6,
   wherein the first portion of the modulated optical comprises half the modulated optical signal; and
   wherein the second portion of the modulated optical comprises half the modulated optical signal.

8. The optomechanical device of claim 6, wherein the circuit is configured to:
   convert the first portion of the modulated optical signal into a first electrical signal, wherein, to generate the cooling feedback signal, the circuit is configured to generate the cooling feedback signal using the first electrical signal; and
   convert the second portion of the modulated optical signal into a second electrical signal, wherein, to generate the mechanical resonance feedback signal, the circuit is configured to generate the mechanical resonance feedback signal using the second electrical signal.

9. The optomechanical device of claim 8, wherein, to generate the cooling feedback signal, the circuit is configured to:
apply the total loop gain of zero to the first electrical signal; and
adjust a phase of the first electrical signal by 180 degrees.

10. The optomechanical device of claim 8, wherein, to generate the mechanical resonance feedback signal, the circuit is configured to:
measure a frequency of the mechanical resonance of the proof mass assembly using the second electrical signal; and
drive a signal generator using the measured frequency of the mechanical resonance.

11. The optomechanical device of claim 1, wherein the circuit is configured to:
regulate an intensity of the optical signal to a predetermined light intensity value before modulating the optical signal.

12. The optomechanical device of claim 1, wherein the proof mass assembly comprises a set of double-ended tuning fork (DETF) structures and wherein the mechanical resonance of a proof mass assembly is a mechanical resonance of the DETF structures.

13. A method for modulating an optical signal for reducing thermal noise and tracking mechanical resonance of a proof mass assembly, the method comprising:
receiving, by a circuit, from a light-emitting device, the optical signal;
modulating, by the circuit, the optical signal to remove thermal noise and to drive a mechanical response frequency to the mechanical resonance of the proof mass assembly using a cooling feedback signal and a mechanical resonance feedback signal;
generating, by the circuit, using the modulated optical signal, the cooling feedback signal to correspond to a thermal noise signal of the modulated optical signal with a total loop gain of zero and a phase difference of 180 degrees; and
generating, by the circuit, using the modulated optical signal, the mechanical resonance feedback signal to drive the mechanical response frequency of the modulated optical signal to the mechanical resonance.

14. The method of claim 13, wherein the optical signal comprises an optical frequency driven to:
an optical resonance frequency of the proof mass assembly plus a quarter of the full width at half maximum (FWHM) of the optical resonance; or
the optical resonance frequency of the proof mass assembly minus a quarter of the FWHM of the optical resonance.

15. The method of claim 13, comprising:
measuring, using the mechanical resonance feedback signal, an acceleration at the proof mass assembly.

16. The method of claim 13,
wherein modulating the optical signal comprises cancelling no more than 20 dB of the optical signal using the cooling feedback signal; and
wherein modulating the optical signal comprises generating the modulated optical signal with a driving signal comprising a power of greater than 20 dB of the optical signal using the mechanical resonance feedback signal.

17. The method of claim 13, comprising:
outputting the modulated optical signal to the proof mass assembly and receiving the modulated optical signal reflected from the proof mass assembly,
wherein generating the cooling feedback signal comprises generating the cooling feedback signal using the modulated optical signal after the modulated optical signal reflected from the proof mass assembly, and
wherein generating the mechanical resonance feedback signal comprises generating the mechanical resonance feedback signal using the modulated optical signal after the modulated optical signal reflected from the proof mass assembly.

18. The method of claim 17, comprising:
splitting the modulated optical signal into a first portion of the modulated optical signal and a second portion of the modulated optical signal,
wherein generating the cooling feedback signal comprises generating the cooling feedback signal using the first portion of the modulated optical signal, and
wherein generating the mechanical resonance feedback signal comprises generating the mechanical resonance feedback signal using the second portion of the modulated optical signal.

19. The method of claim 18,
wherein the first portion of the modulated optical comprises half the modulated optical signal; and
wherein the second portion of the modulated optical comprises half the modulated optical signal.

20. An optomechanical system for modulating an optical signal for reducing thermal noise and tracking mechanical resonance of a proof mass assembly, the optomechanical system comprising:
a light-emitting device configured to emit the optical signal;
the proof mass assembly; and
a circuit configured to:
receive, from the light-emitting device, the optical signal;
modulate the optical signal to remove thermal noise and to drive a mechanical response frequency to the mechanical resonance of the proof mass assembly using a cooling feedback signal and a mechanical resonance feedback signal;
generate, using the modulated optical signal, the cooling feedback signal to correspond to a thermal noise signal of the modulated optical signal with a total loop gain of zero and a phase difference of 180 degrees; and
generate, using the modulated optical signal, the mechanical resonance feedback signal to drive the mechanical response frequency of the modulated optical signal to the mechanical resonance.

* * * * *